(12) United States Patent
Mambu

(10) Patent No.: US 12,007,914 B2
(45) Date of Patent: Jun. 11, 2024

(54) DIRECT DATA TRANSFER SYSTEM

(71) Applicant: Commissariat à l'Energie Atomique et aux Energies Alternatives, Paris (FR)

(72) Inventor: Kevin Mambu, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 3 days.

(21) Appl. No.: 18/068,355

(22) Filed: Dec. 19, 2022

(65) Prior Publication Data

US 2023/0205710 A1   Jun. 29, 2023

(30) Foreign Application Priority Data

Dec. 29, 2021 (FR) ..................................... 2114646

(51) Int. Cl.
  *G06F 13/16*  (2006.01)
  *G06F 13/28*  (2006.01)

(52) U.S. Cl.
  CPC .......... *G06F 13/1668* (2013.01); *G06F 13/28* (2013.01)

(58) Field of Classification Search
  CPC .............................. G06F 13/1668; G06F 13/28
  See application file for complete search history.

(56) References Cited

U.S. PATENT DOCUMENTS

| | | | | |
|---|---|---|---|---|
| 2018/0137407 A1* | 5/2018 | Du | .......................... | G06N 3/063 |
| 2019/0197420 A1* | 6/2019 | Singh | ...................... | G06N 3/063 |
| 2020/0081651 A1* | 3/2020 | Aga | ....................... | G06F 3/0679 |
| 2020/0327079 A1* | 10/2020 | Zhao | ......................... | G06N 3/08 |
| 2021/0157594 A1* | 5/2021 | Lin | ......................... | G06F 9/3802 |
| 2022/0012593 A1* | 1/2022 | Huang | ................... | G06N 3/045 |

FOREIGN PATENT DOCUMENTS

| | | |
|---|---|---|
| EP | 3252774 B1 | 1/2019 |
| EP | 3503103 A1 | 6/2019 |
| EP | 3660849 A1 | 6/2020 |

OTHER PUBLICATIONS

Preliminary Search Report for French Application No. 2114646 dated Aug. 31, 2022, 2 pages.
Vujic, N., Cabarcas, F., Tallada, M. G., Ramirez, A., Martorell, X., & Ayguade, E. (2010). DMA++: On the fly data realignment for on-chip memories. IEEE Transactions on Computers, 61(2), 237-250.

* cited by examiner

*Primary Examiner* — Henry Tsai
*Assistant Examiner* — Harry Z Wang
(74) *Attorney, Agent, or Firm* — Jordan IP Law, LLC

(57) ABSTRACT

The present description concerns a system comprising a processor and an SDMA circuit of direct transfer of a data sequence between a source memory circuit and a destination memory circuit, a sub-region of the source circuit comprising the elements of a data array, the SDMA decoding computing kernel information called BIT_PATTERN of an elementary data pattern to be transferred defined from an elementary array having a predefined size smaller than the size of said data array and intended to identify an elementary array window of said array, each element of the elementary array comprising a bit capable of taking a state "1" or "0" according to whether the element belongs or not to said pattern, the SDMA recovering the data of said array associated with elements of the BIT_PATTERN having their bit at "1".

9 Claims, 6 Drawing Sheets

| Opcode | Parameters | | | | | | |
|---|---|---|---|---|---|---|---|
| SET_REGION | BASE_ADDR | | EL_SI2E | | R_WIDTH | | |
| READ_TRANSFER | X pos | Y pos | IMC address | Src off. | Dst off. | Length | Pattern | Op. mode |
| COPY | IMC address 1 | IMC address 2 | Src off. | Dst off. | Length | Pattern | Op. mode |
| WRITE_TRANSFER | X pos | Y pos | IMC address | Dst off. | Src off. | Length | Pattern | Op. mode |
| BLOCKING_WAIT | | | | | | | |

DIRECT DATA TRANSFER SYSTEM

FIELD

The present disclosure generally concerns the field of memory circuits, and more particularly aims at the implementation of direct data transfers towards and from a memory circuit.

BACKGROUND

Memory circuits adapted to implementing computing operations, or smart memory circuits, have already been provided. Such circuits are for example intended to cooperate with a processor, to relieve the processor of certain computing tasks.

However, the data used for the computing operations requested by the processor from such a memory circuit are not always present in the smart memory circuit. Further, even if they are present in the memory circuit, they are not necessarily stored in a desired space in the memory circuit or according to an ideal storage order, which may require operations of data manipulation in the memory circuit by read/write operations orchestrated by the processor. Thus, it is desirable to find solutions to further relieve the use of the processor and generally the data exchange channels used by the processor.

More generally, in any system comprising a processor and a memory circuit, smart or not, it is often necessary to perform data transfers between the memory circuit and another device, for example another memory circuit, and possibly to reorganize the data during the transfer. Here again, it is desirable to find solutions to relieve the use of the processor and generally the data exchange channels used by the processor during the implementation of such transfers.

SUMMARY

An embodiment provides a system comprising:
  at least a first and a second memory circuits; and
  a circuit of direct data transfer between the first and second memory circuits,
wherein the direct transfer circuit is adapted to receiving specific instructions from an external processor, and to decoding said instructions and accordingly control data transfers between the first and second circuits,
wherein said specific instructions comprise:
  a specific instruction SET_REGION of definition of a sub-region in the first memory circuit towards and from which the data will be transferred; and
  a specific instruction of transfer between said sub-region and the second memory circuit, the specific transfer instruction comprising a first address field containing the relative coordinates, in said sub-region, of a first reference cell,
and wherein the direct transfer circuit is adapted to executing a plurality of successive instructions of transfer towards or from a same sub-region between two executions of an instruction SET_REGION.

According to an embodiment of the system, the system is such that:
  said sub-region is a sequence of consecutive locations in terms of addressing in the first memory circuit, containing the elements of an array;
  instruction SET_REGION comprises a first field containing the address of a first memory cell of the sub-region, a second field containing the dimension of the elements of the array, and a third field containing the width of the rows of the array; and
  said first address field of the transfer instruction comprises first and second sub-fields containing the coordinates, row and column, in said array of the first reference cell.

According to an embodiment of the system, the system is such that the second memory circuit is a smart memory circuit adapted to implementing computing operations and to performing elementary operations including a reading or a writing of data from or into the memory circuit or a calculation based on data present in the memory circuit, and the direct transfer circuit is associated with said second memory circuit either due to its hardware positioning close to the second memory circuit or due to a configuration of the direct transfer circuit by means for example of a register of configuration of the direct transfer circuit which is accessible to the external processor, the direct transfer circuit knowing, due to this association, the system address range enabling to access the smart memory circuit via a system bus comprising an address bus; and the specific transfer instruction comprises a second address field containing the relative coordinates, in this system address range dedicated to the smart memory circuit, of a second reference cell, the number of bits of the second address field being smaller than the size of the address bus.

According to an embodiment of the system, the system is such that it comprises a specific instruction READ_TRANSFER of control of the transfer of a data sequence from said sub-region of the first memory circuit to the second smart memory circuit, and comprising a specific instruction WRITE_TRANSFER of control of a transfer of a data sequence from the second smart memory circuit to said sub-region in the first memory circuit.

According to an embodiment of the system, the system is such that it comprises a first set of addressing registers storing first values of the first field, of the second field, and of the third field of a first instruction SET_REGION received by the direct transfer circuit and further comprising a second set of addressing registers storing second values of the first field, of the second field, and of the third field of a second instruction SET_REGION received by the direct transfer circuit to define a second sub-region; and a specific transfer instruction comprises a second address field containing the relative coordinates, in said second sub-region, of a first reference cell in this second sub-region.

According to an embodiment of the system, the system is such that the specific transfer instruction further comprises a fourth field defining a reading offset, in the first source memory circuit, between two consecutive iterations of an elementary pattern to be transferred, a fifth field defining a writing offset, in the second destination memory circuit, between two consecutive iterations of the elementary pattern to be transferred, a sixth field defining the number of iterations of the elementary pattern to be transferred, and a seventh field defining the elementary pattern of the sequence to be transferred.

According to an embodiment of the system, the system is such that the direct transfer circuit comprises a memory containing a plurality of predefined elementary patterns, the transfer instruction comprising a field containing a code of selection of one of said predefined elementary patterns.

According to an embodiment of the system, the system is such that said specific instructions comprise a specific instruction of control of an internal data transfer within the same memory circuit.

According to an embodiment of the system, the system is such that it comprises an internal data exchange link directly coupling the second memory circuit to the direct transfer circuit.

According to an embodiment of the system, the system is such that it comprises at least one third memory circuit, the direct transfer circuit being further adapted to directly transferring data between the first and third memory circuits and between the second and third memory circuits.

According to an embodiment of the system, the system is such that the direct transfer circuit is adapted to transferring a data sequence between the first and second memory circuits respectively called source memory circuit and destination memory circuit, a sub-region of the source memory circuit comprising a sequence of consecutive locations in terms of addressing containing the elements of a data array, wherein the direct transfer circuit is adapted to receiving and decoding computing kernel information called BIT_PATTERN of an elementary data pattern to be transferred defined from an elementary array having a predefined size smaller than the size of said data array and intended to identify an elementary array window of said array, each element of the elementary array comprising a bit capable of taking a first or a second state according respectively to whether the element does not belong or belongs to said pattern, the elementary array of the BIT_PATTERN comprising a reference element; the direct transfer circuit receiving a source address for a first pattern to be transferred, this source address corresponding to the address in said sub-region of said reference element of the BIT_PATTERN and corresponding to a reference piece of data of said data array located at this source address, the other elements of the BIT_PATTERN being associated with other data of said array by relative positioning with respect to, respectively, the reference element of the BIT_PATTERN and the reference piece of data of said array; the direct transfer circuit being adapted, during the execution of the transfer of an elementary pattern, to recovering the data of said array associated with elements of the BIT_PATTERN having their bit in said second state.

Another embodiment provides a system comprising:
  a processor;
  a circuit of direct transfer of a data sequence between a source memory circuit and a destination memory circuit without transiting through the processor, a sub-region of the source memory circuit comprising a sequence of consecutive locations in terms of addressing containing the elements of a data array, wherein the direct transfer circuit is adapted to receiving and decoding computing kernel information called BIT_PATTERN of an elementary data pattern to be transferred defined from an elementary array having a predefined size smaller than the size of said data array and intended to identify an elementary array window of said array, each element of the elementary array comprising a bit capable of taking a first or a second state according respectively to whether the element does not belong or belongs to said pattern, the elementary array of the BIT_PATTERN comprising a reference element; the direct transfer circuit receiving a source address for a first pattern to be transferred, this source address corresponding to the address in said sub-region of said reference element of the BIT_PATTERN and corresponding to reference piece of data of said data array located at this source address, the other elements of the BIT_PATTERN being associated with other data of said array by relative positioning with respect to, respectively, the reference element of the BIT_PATTERN and the reference piece of data of said array; the direct transfer circuit being adapted, during the execution of the transfer of an elementary pattern, to recovering the data of said array associated with elements of the BIT_PATTERN having their bit in said second state.

According to an embodiment, the system is such that said direct transfer circuit is adapted to running through said elementary array of the BIT_PATTERN in a predefined direction, thus considering a sequence of elements of the elementary array having the second state and to successively transferring the data of the array present in the source memory circuit and respectively associated with this sequence of elements.

According to an embodiment, the system is such that said direct transfer circuit is adapted to writing, into the destination memory circuit, the data recovered for an elementary pattern around a reference piece of data by rearranging them in a row or column vector, and the destination memory circuit is a smart memory circuit adapted to implementing computing operations and to performing elementary operations including a reading or a writing of data from or into the memory circuit or a calculation based on data present in the memory circuit.

According to an embodiment, the system is such that said sub-region is a sequence of consecutive locations in terms of addressing defined from a base address BASE_ADDR containing the address of a first memory cell of the sub-region, each piece of data of the array having a dimension defined by a parameter EL_SIZE, the widths of the rows of the array being defined by a parameter R_WIDTH; the address of a piece of data in the array being defined by relative coordinates Xpos and Ypos corresponding to the coordinates, row and column, in said array and from said base address BASE_ADDR, and from said parameter EL_SIZE, and the data of the array are stored along a predefined direction of travel through the array.

According to an embodiment, the system is such that the coordinates $S[i] \cdot x$, in the row direction, and $S[i] \cdot y$, in the column direction, of an element of said elementary array associated with a BIT_PATTERN are defined by positive or negative indexes around zero coordinates associated with said reference element of the elementary array, the positive or negative indexes of a coordinate of an element of the elementary array being defined according to said data array and to said predefined direction of travel through said elementary array.

According to an embodiment, the system is such that the address Addr(Ax,y) of a piece of data of the array is defined according to the following formula:

$$\mathrm{Addr}(Ax,y) = \mathrm{BASE\_ADDR} + EL\_SIZE * (Xpos * R\_WIDTH + YPos),$$

and the address Addr(S[i]) of a piece of data of the array corresponding to an element of the BIT_PATTERN to be transferred is defined according to the following formula:

$$\mathrm{Addr}(S[i]) = \mathrm{BASE\_ADDR} + EL\_SIZE * (S[i] \cdot x * R\_WIDTH + S[i] \cdot y).$$

According to an embodiment, the system is such that said data sequence comprises a plurality of iterations of transfer of a same elementary pattern defined from a same BIT_PATTERN associated with said sequence of elements of the elementary array, each transfer iteration aiming at transferring data respectively located in a plurality of predefined elementary array windows of same dimensions of the source memory circuit and offset with respect to one another, the offsets being defined by a sequence of address offsets from the address of the source piece of data of the first elementary window, and the direct transfer circuit is adapted, during the execution of the transfer, to performing for each element in the sequence of elements, a sequence of readings from the source memory circuit of the data corresponding to a same element of the elementary array but respectively located in said plurality of elementary array windows, by defining the successive addresses of the data of this sequence from the address of a first piece of data corresponding to this element and associated with a first elementary array window and from said sequence of offsets and the transfer circuit is adapted to transferring the data of said elementary array windows by respectively arranging them in distinct column vectors in the destination memory circuit, a sequence of data associated with a same elementary array element of the BIT_PATTERN being written into successive locations in terms of addressing of the destination memory in one or a plurality of rows of the destination memory.

According to an embodiment, the system is such that the direct transfer circuit is adapted to receiving and decoding the following transfer parameters:

SEQ_LEN: the number of iterations of the elementary pattern in the data sequence to be transferred;

SRC_OFFSET: the offset of the source addresses between two successive iterations of the elementary pattern of the data sequence to be transferred;

DST_OFFSET: the offset of the write addresses, in the destination memory circuit between two successive iterations of the elementary pattern of the data sequence to be transferred.

According to an embodiment, the system is such that it comprises at least one first and one second memory circuits; and the direct transfer circuit being adapted to directly transferring data between the first and second memory circuits, the direct transfer circuit is adapted to receiving specific instructions from an external processor, and to decoding said instructions and accordingly control data transfers between the first and second circuits, said specific instructions comprise:

a specific instruction SET_REGION of definition of a sub-region in the first memory circuit towards and from which the data will be transferred; and a specific instruction of transfer between said sub-region and the second memory circuit, the specific transfer instruction comprising a first address field containing the relative coordinates, in said sub-region, of a first reference cell, and the direct transfer circuit is adapted to executing a plurality of successive instructions of transfer towards or from a same sub-region between two executions of an instruction SET_REGION.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the different elements of the described memory modules and systems has not been detailed, the forming of these elements being within the abilities of those skilled in the art based on the indications of the present description.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

Figure 1:
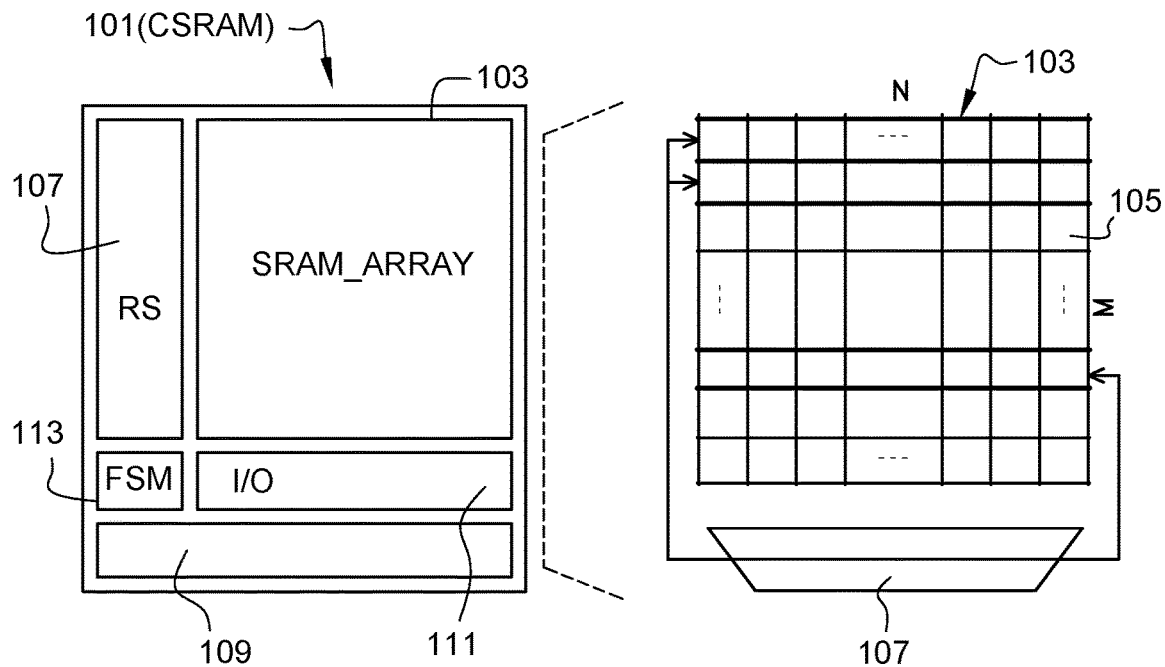
FIG. 1 schematically shows an example of a memory circuit adapted to implementing computing operations.

FIG. 1 schematically shows an example of a memory circuit 101 (CSRAM) adapted to implementing computing operations. Circuit 101 comprises an array 103 (SRAM_ARRAY) of elementary storage cells, for example, SRAM ("Static Random Access Memory") cells. In the right-hand portion of the drawing, certain elements of memory circuit 101, and in particular the array 103 of elementary storage cells, have been shown in further detail. In this example, array 103 comprises M rows and N columns of elementary storage cells 105, M and N being integers greater than or equal to 2. As an example, array 103 is similar to the arrays described in patent application EP3252774 previously filed by the applicant.

Memory circuit 101 further comprises a row selection circuit 107 (RS) adapted to selecting a single row of array 103 to perform a conventional read or write operation. Row selection circuit 107 may further be adapted to simultaneously selecting a plurality of rows of array 103, to implement, on column output conductive tracks of the array, the basic logic operations having as operands data stored in the selected rows.

Memory circuit 101 may further comprise a computing circuit 109 (ALU) adapted to implementing additional computing operations based on the signals read from the column output conductive tracks of array 103 and/or to directly rewriting into array 103 the result of a computing operation, without transiting through external connection terminals of memory circuit 101.

Memory circuit 101 further comprises an input/output circuit 111 (I/O) coupling the array columns to terminals of connection to the outside of the memory circuit, for example to a data input/output port (not detailed in FIG. 1) of the memory circuit.

The memory circuit of FIG. 1 further comprises a control circuit 113 (FSM) coupled to circuits 107, 109, and 111. Circuit 113 is adapted to decoding and controlling the execution of read, write, and/or computing instructions transmitted by an external control circuit (not shown), for example, a processor.

Patent application EP3503103 previously filed by the applicant describes an example of integration of a memory circuit adapted to implementing computing operations in a system comprising a processor. In this system, the read and write accesses to the memory circuit adapted to implementing computing operations are performed via the processor. This may cause slowdowns of the system when significant quantities of data are transferred from or to the memory circuit adapted to implementing computing operations.

Figure 2:
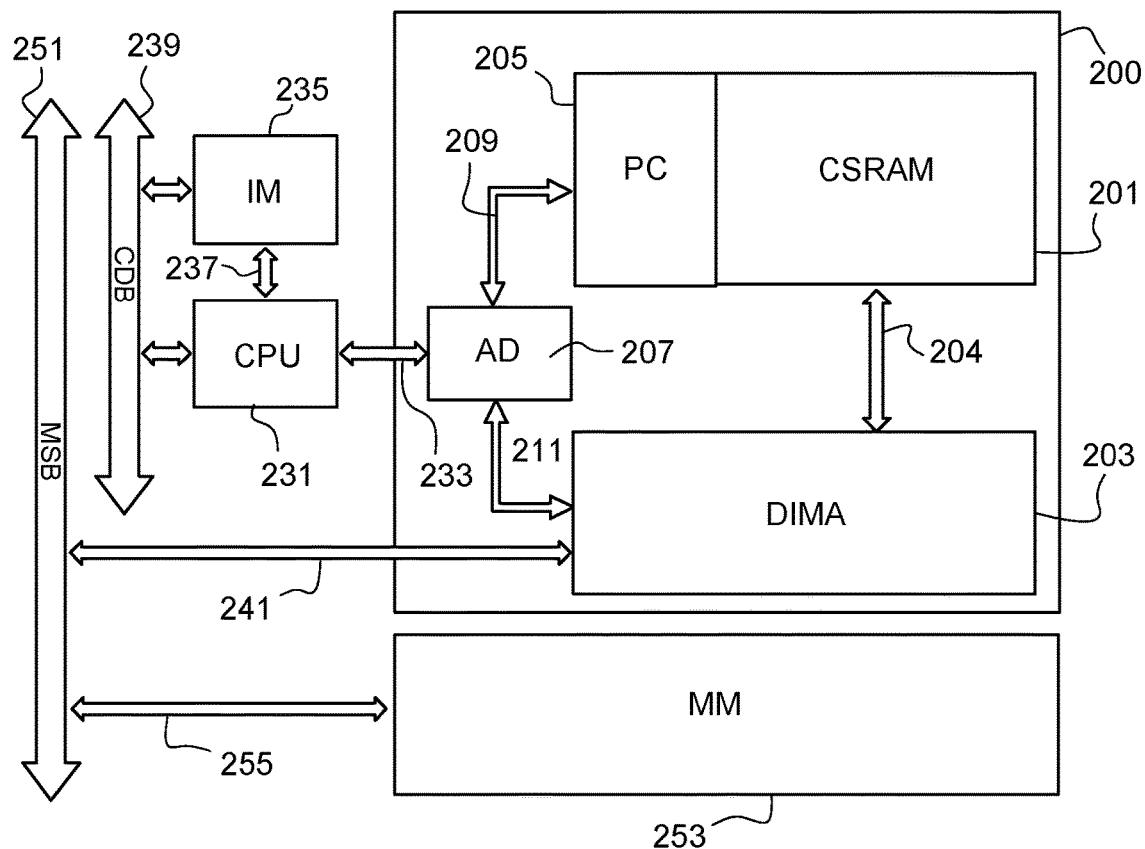
FIG. 2 schematically shows an example of a system comprising a memory module adapted to implementing computing operations and a data transfer circuit coupled to said memory module according to an embodiment.

FIG. 2 schematically shows an example of a system comprising a memory module 200 adapted to implementing computing operations according to an embodiment.

The memory module 200 of FIG. 2 comprises a memory circuit 201 (CSRAM) adapted to implementing computing operations.

Memory circuit 201 may be a memory circuit of IMC ("In Memory Computing") type, that is, where computing operations are implemented directly inside of the array of elementary cells of the memory circuit, for example, as described in relation with FIG. 1 or in the above-mentioned patent application EP3252774. More generally, memory circuit 201 may be any memory circuit adapted to implementing computing operations, for example a circuit of NMC ("Near Memory Computing") type, that is, where the computing operations are not performed directly within the array of elementary cells of the memory circuit, but in integrated computing circuits at the immediate periphery of the array of elementary cells.

The system of FIG. 2 comprises a processor 231 (CPU). More generally, processor 231 may be replaced with any circuit adapted to generating a flow of control instructions. The system of FIG. 2 further comprises an instruction memory 235 (IM) directly coupled to processor 231 via a link 237. Processor 231 and instruction memory 235 are further coupled to a same system bus 239 (CDB), also called processor system bus or processor data bus or CPU data bus ("CPU data bus"). Bus 239 may be a bus of the type conventionally used to exchange data between a processor and peripherals, for example, memory circuits, of a data processing system. Bus 239 may in particular comprise a data bus, an address bus, and/or a control bus. Bus 239 may be implemented by means of a distributed interconnection system of network-on-chip type.

Module 200 further comprises a circuit 203 (DIMA) of direct access to circuit 201. Circuit 203 is directly coupled to memory circuit 201, via a data transfer link 204 internal to module 200. Circuit 203 is further directly coupled to a data transfer system bus 251 (MSB), also called memory system bus external to module 200, via a link 241. In this example, memory system bus 251 is not directly connected to processor 231. Bus 251 is a bus specifically dedicated to the direct transfer (i.e. without transiting through processor 231) of data between the memory circuit 201 of module 200 and other peripheral circuits of the system, for example, a distant memory, or any other internal or external memory likely to exchange data with memory circuit 201. Bus 251 may in particular comprise a data bus, an address bus, and/or a control bus. Bus 251 may be implemented by means of a distributed interconnection system of network-on-chip type.

It should be noted that memory system bus 251 and system bus 239 may advantageously be coupled to each other by different interface circuits. Further, system bus 239 and memory system bus 251 may be one and the same bus, even if this is not the preferred embodiment. Indeed, system 239 is often of small size for the data and putting the two buses in common might result in having a bus 251 of small size, and further in increasing the necessary flow rate on the common bus, which might in practice result in a saturation of the bus, and indirectly in a decrease of the data exchange flow rate with respect to a configuration with two buses.

Preferably, memory system bus 251 is wider than processor system bus 239. Data transfer link 204 preferably has a width equal to the size of the largest data vector capable of being read at once from memory circuit 201, for example equal to the size of a row of readout circuits present at the column feet in the array of elementary storage cells of memory circuit 201. As a variant, link 204 may have a width equal to a sub-multiple of the size of the largest data vector capable of being read at once from memory circuit 201. Bus 251 may have a width equal to the width of link 204. As a variant, the width of bus 251 may be a sub-multiple of the width of link 204. The width of link 204 is preferably greater than the width of an input/output port of processor 231. It should be noted that by width of a bus, of a port, or of a link, there is here meant the width of the data capable of transiting in parallel over the bus, the port, or the link (independently from possible additional address and/or control signals).

Direct access circuit 203, also called direct transfer circuit, is adapted to directly transferring data, that is, without having these data transit through processor 231, between memory circuit 201 and memory system bus 251. In the shown example, the system further comprises a memory circuit 253 (MM) external to module 200. Memory circuit 253 is coupled to memory system bus 251 via a link 255. Thus, direct access circuit 203 enables to directly transfer data, that is, without having these data transit through processor 231, between the memory circuit 201 of module 200 and external memory circuit 253. More generally, direct access circuit 203 enables to transfer data directly, that is, without having these data transit through processor 231, between the memory circuit 201 of module 200 and any peripheral circuit connected to memory system bus 251. As a non-limiting example, memory circuit 253 may be a SRAM-type memory, a NVM-type memory ("Non Volatile Memory"), a DRAM-type memory ("Dynamic Random Access Memory"), a Flash-type memory, or also another memory circuit adapted to implementing computing operations. The different components of module 200 may be integrated in a same integrated circuit chip. Memory circuit 253 may be integrated to this same chip, or external to this chip.

In the example of FIG. 2, unit 200 further comprises a control circuit 205 (PC, for Pipeline Controller) adapted to organizing the accesses to memory circuit 201 required by processor 231. Circuit 205 is adapted to decoding the instructions received from processor 231 and to decomposing, if necessary, each received instruction into a sequence of a plurality of sub-operations also called elementary operations. Elementary operation means an operation of reading from, writing into, or computing in memory circuit 201. A computing operation may possible comprise only actuating a computing unit appended to the memory array (in the case for example of a NMC-type memory). A calculation operation may also comprise performing an operation of reading from one or a plurality of rows with the actuation of computing means placed at the column feet in the case, for example, of an IMC-type memory. Generally, it can be considered that an elementary operation can be performed within a cycle of access to memory circuit 201, as for example described in French patent application No. 20/08272 filed on Aug. 4, 2020 by the applicant in relation with FIGS. 4A, 4B.

The module 200 of FIG. 2 further comprises a circuit 207 (AD) for distributing the requests from processor 231. Circuit 207 is coupled to processor 231 via a link 233. Circuit 207 is further coupled to the control circuit 205 of memory circuit 201 by a link 209 internal to module 200, and to direct access circuit 203 by a link 211 internal to module 200. Circuit 207 enables to control the distribution of the instruction flow originating from processor 231 between, on the one hand, memory circuit 201 (via link 209 and control circuit 205) and, on the other hand, direct access circuit 203 (via link 211). A mechanism of memory mapping type may be provided to perform the routing of the instructions to one or the other of memory circuit 201 and of direct access circuit 203, according to an addressing field contained in the instruction.

Processor 231 may require read or write accesses to memory circuit 201, or also the execution of computing operations by memory circuit 201. The processor may further require direct transfers (via circuit 203) of data between memory circuit 201 and a peripheral circuit external to module 200, for example, memory circuit 253. These requests are distributed between control circuit 205 and direct access circuit 203 by distribution circuit 207.

Figure 3:
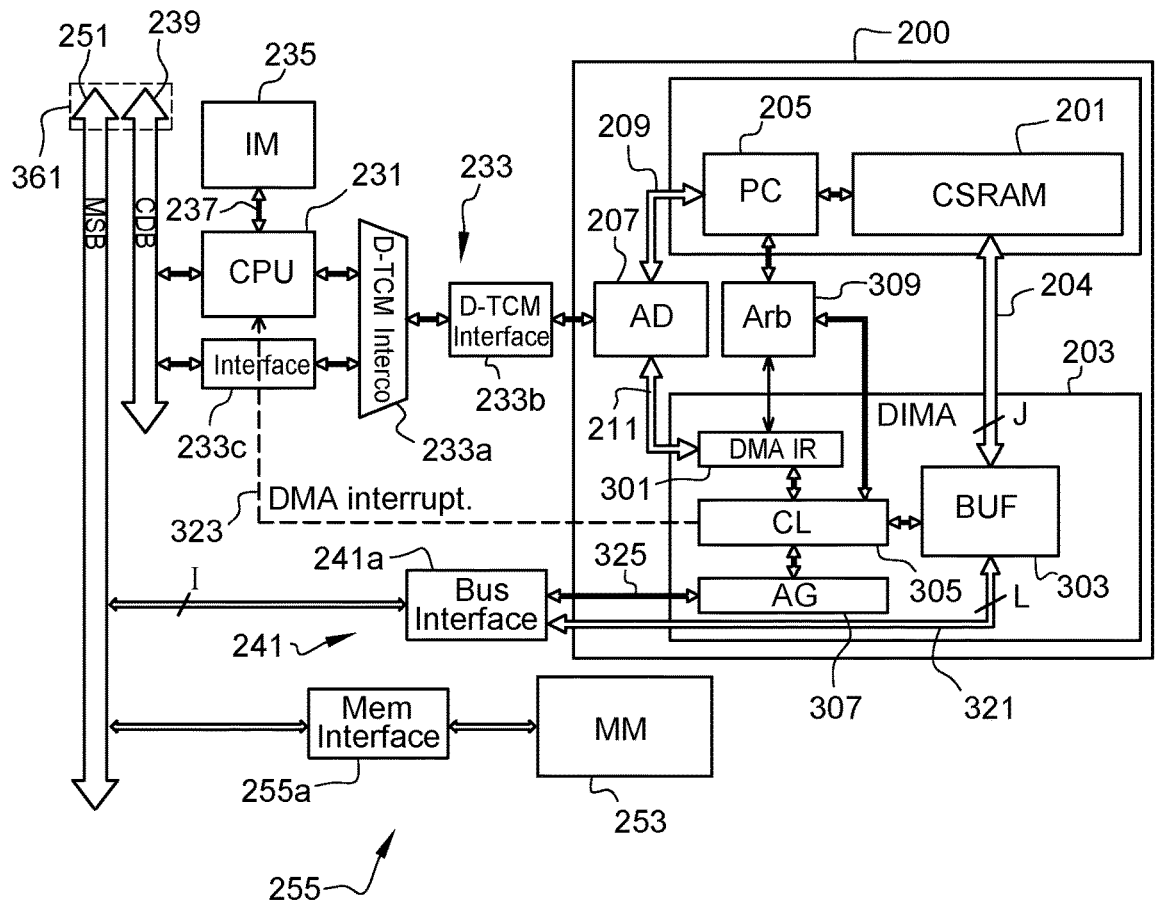
FIG. 3 illustrates in further detail an example of implementation of the system of FIG. 2.

FIG. 3 illustrates in further detail an example of implementation of the system of FIG. 2.

The system of FIG. 3 comprises the same elements as in the example of FIG. 2, arranged substantially in the same way.

In the example of FIG. 3, different elements of the direct access circuit 203 of module 200 have been shown in further detail.

More particularly, in this example, circuit 203 comprises an assembly 301 (DMA IR) of one or a plurality of instruction registers. Registers 301 receive instructions from processor 231, over link 211. Registers 301 store transfer instructions to be executed by circuit 203.

The instructions stored in registers 301 are for example dedicated instructions of control of direct access circuit 203, particularly containing the source and destination address ranges of the transfers to be performed, and information relative to the size and, possibly, to the arranging (pattern) of the data to be transferred into the source memory circuit and into the destination memory circuit (to enable to modify the data pattern during their transfer between the source and the destination).

An example of instruction format will be described in further detail hereafter in relation with FIG. 7.

Figures 7, 8:
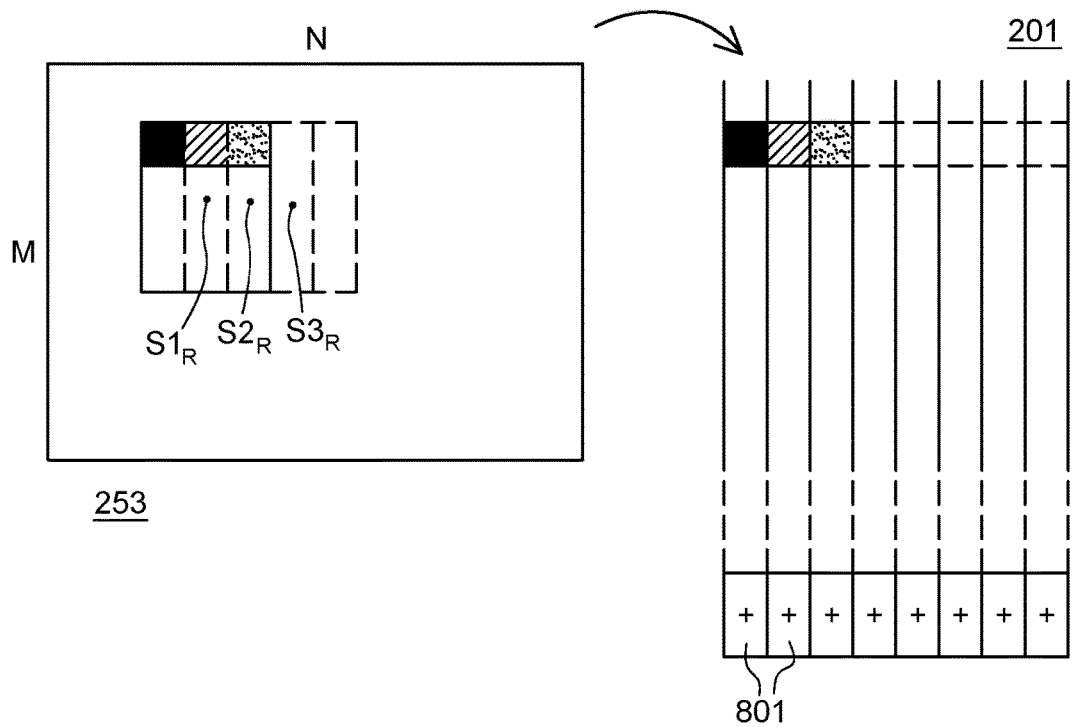
FIG. 7 schematically illustrates an example of format of an instruction signal used by the processor to control the data transfer circuit in the system of FIG. 2.
FIG. 8 schematically illustrates the execution of a data transfer operation in the system of FIG. 2.

An advantage of the embodiment described in relation with FIG. 7 is that the set of parameters required to implement a data transfer may be transmitted to circuit 203 by means of a single instruction or of a small number of instructions. This enables to decrease the number of processor occupancy cycles with respect to a system where the different parameters of the transfer are successively written into specific configuration registers of the direct access circuit. Indeed, in this case, a write cycle is necessary for each parameter of the transfer. In the solution described in relation with FIG. 7, a plurality of parameters are simultaneously transmitted in a same instruction, during a same cycle. The described embodiments are however not limited to this specific case.

Circuit 203 further comprises a buffer circuit 303 (BUF) coupled to memory circuit 201 via internal link 204, and to memory system bus 251 via a data transfer link 321. Buffer circuit 303 temporarily stores the data transiting from memory circuit 201 to memory system bus 251, or from memory system bus 251 to memory circuit 201.

Circuit 203 further comprises a logic control circuit 305 (CL). Logic control circuit 305 is coupled on the one hand to instruction registers 301 and on the other hand to buffer circuit 303. Circuit 305 is adapted to decoding the instructions stored in registers 301. Circuit 305 is adapted to controlling data transfers possibly inside of buffer circuit 303, and between buffer circuit 303 and links 204 and 321, according to the state of the execution of an instruction previously stored in registers 301. When the execution of a data transfer instruction required by processor 231 is finished, logic control circuit 305 sends an interrupt to processor 231 to inform it thereof. The interrupt may be transmitted over a link 323 (DMA interrupt) connecting circuit 305 to processor 231.

Circuit 203 further comprises an address generation circuit 307 (AG). Circuit 307 is coupled to logic control circuit 305. Circuit 307 is further coupled to memory system bus 251 via an address signal transfer link 325. Address generation circuit 307 is adapted to generating an address signal sequence to successively transfer the data between buffer circuit 303 and bus 251, according to the instructions stored in registers 301.

In the example shown in FIG. 3, the link 241 coupling direct access circuit 203 to memory system bus 251 comprises a bus interface circuit 241a (Bus Interface). Circuit 241a is for example a master bus interface circuit. Circuit 241a comprises a first port coupled, for example, connected, to bus 251, and a second port coupled, for example, connected, respectively to a data input/output port of buffer circuit 303 (via link 321) and to an address signal input/output port of address generator 307 (via link 325).

In the example of FIG. 3, the link 255 coupling memory system bus 251 to external memory circuit 253 comprises a bus interface circuit 255a (Mem Interface). Circuit 255a is for example a slave bus interface circuit. Circuit 255a comprises a first input/output port coupled, for example, connected, to bus 251, and a second input/output port coupled, for example, connected, to an input/output port of memory circuit 253.

Further, in the example of FIG. 3, the link 233 coupling processor 231 to access distribution circuit 207 comprises a multiplexer 233a (D-TCM interco) and an interface circuit 233b (D-TCM interface). Interface circuit 233b is for example a slave interface circuit. Multiplexer 233a comprises a first input/output port coupled, for example, connected, to an input/output port of processor 231. Multiplexer 233a further comprises a second input/output port directly coupled (that is, without transiting through processor 231) to the processor system bus 239 of the system. In the shown example, a bus interface circuit 233c (Interface), for example a slave interface circuit, forms an interface between processor system bus 239 and the second input/output port of multiplexer 233a. Interface circuit 233c comprises a first input/output port coupled, for example, connected, to bus 239, and a second input/output port coupled, for example, connected, to the second input/output port of multiplexer 233a. Multiplexer 233a further comprises a third input/output port coupled, for example, connected, to a first input/output port of interface circuit 233b. Interface circuit 233b has a second input/output port coupled, for example, connected, to an input/output port of circuit 207. In operation, the multiplexer is adapted to alternately connecting one or the other of its first and second input/output ports to its third input/output port, so as to couple the input/output port of access distribution circuit 207 either to processor 231 or directly to processor system bus 239.

In the example of FIG. 3, unit 200 further comprises an arbitration circuit 309 coupled, for example, connected, on the one hand to the control circuit 205 of memory circuit 201, and on the other hand to the control circuit 305 of direct access circuit 203. Arbitration circuit 309 may further be coupled, for example, connected, to the instruction registers 301 of direct access circuit 203. Circuit 309 is adapted to managing the execution of the instructions carried out in fine by memory circuit 201 to arbitrate between potentially simultaneous access requests originating from processor 231 or from direct access circuit 203. More particularly, while circuit 207 has the function of distributing the instructions received from processor 231 respectively to the control circuit 205 of the memory circuit 201 of unit 200 and to the instruction registers 301 of the direct access circuit 203 of unit 200, arbitration circuit 309 (Arb) manages possible conflicts between requests for carrying out the elementary operations in memory circuit 201 during the execution of the instructions requested by the processor either directly from the memory circuit or from direct access circuit 203. More specifically, each instruction is decomposed into a sequence of elementary operations by control circuit 205 or by control circuit 305. In other words, arbitration circuit 309 performs an arbitration between two different parallel flows of elementary operation requests, that is:
  a first flow corresponding to the instructions sent by processor 231 to memory circuit 201, generated by control circuit 205; and
  a second data flow corresponding to the execution of the data transfers between memory circuit 201 and external memory circuit 253, generated by control circuit 305.

The requests received by arbitration circuit 309 from control circuit 205 and from control circuit 305 are authorized or delayed by the arbitration circuit according to the possible conflicts of requests for access to memory circuit 201. In other words, arbitration circuit 309 transmits to the control circuit 205 of memory circuit 201 a single elementary operation request flow, called general flow, corresponding to an interlaced combination of the first and second flows, according to a sequencing defined by predefined priority rules. The granularity of the interlacing of the first and second flows may be at the scale of the elementary operations, or at a higher-level scale, that is, at the scale of a group of elementary operations.

The instructions sent by processor 231 to control circuit 205 or written into instruction registers 301 may comprise priority bits used in fine by arbitration circuit 309 to decide of the order of processing of the elementary operations. Thus, according to an embodiment, the first and second elementary operation request flows received by arbitration circuit 309 may each include one or a plurality of priority bits indicating the corresponding priority of each elementary operation according to the priority indicated by the processor during the sending of the corresponding instruction. In the case, for example, where arbitration circuit 309 simultaneously receives elementary operation requests for each of the first and second flows, then a default rule may be provided for their processing. Priority may for example be always given to the first flow or priority may be alternately given between the two flows.

The link 204 coupling memory circuit 201 to direct access circuit 203, enabling to perform direct data transfers (without transiting through processor 231) between memory circuit 201 and distant memory 253, is for example adapted to only transmitting data signals corresponding to the data read from or to be written into memory circuit 201 and respectively corresponding to data written into or read from buffer circuit 303.

The width of the data capable of being simultaneously transmitted via link 204 is for example equal to or greater than the width of memory system bus 251. The described embodiments are however not limited to this specific case.

For each elementary operation request of the second flow, address and control signals used to indicate the address of each piece of data to be transferred, the type of access to be performed (reading or writing), the size of the piece of data to be transferred, etc., may be transmitted by circuit 305 to the control circuit 205 of memory circuit 201, via the arbitration circuit or possibly directly. Whatever the embodiment, it is necessary to provide a synchronization mechanism between the arbitration circuit, control circuit 205, and the direct access circuit to ascertain that the address and control signals corresponding to an elementary operation request transmitted by logic circuit 305 are taken into account by the memory circuit for the execution of the elementary operation at the same time as the data to be written into or read from buffer circuit 303 transit over link 204 for this same elementary operation. Thus, for example, it may be provided for an elementary operation request transmitted to the arbitration circuit by logic circuit 305 to include all the address and control information and for the arbitration circuit to send to logic circuit 305 information, of acknowledgement request type, to signify thereto that it starts the execution of the elementary operation in memory circuit 201, and then that the data transfer circuit can send a piece of data over link 204 (in the case of a writing into memory circuit 201) or recover a piece of data over link 204 (in the case of a reading from memory circuit 201). Other synchronization mechanisms between arbitration circuit 309, memory circuit 201, and direct transfer circuit 203 may of course be implemented.

Further, the arbitration circuit has been previously shown as a circuit different from the control circuit 205 of memory circuit 201 to mainly highlight the function of arbitration between two elementary operation request flows desiring access to a same resource, that is, array 103 and the memory computing means (for example, 107). This arbitration function may for example be performed by the control circuit 205 of memory circuit 201. Control circuit 205 would thus have a direct dialog with logic circuit 305 and more generally direct access circuit 203. Control circuit 205 would thus receive, via two input/output ports, instruction requests from processor 231 and instruction requests from circuit 203 in the form of elementary operation requests, or possibly in the form of higher-level instructions to be decoded by circuit 205 by for example using the same decoder as that used to decode the instructions originating from processor 231. According to another embodiment, the instruction decoder circuit present in control circuit 205 is "offset" in arbitration circuit 309 and control circuit 205 processes and receives a single general operation request flow sent by arbitration circuit 309.

Figure 4:
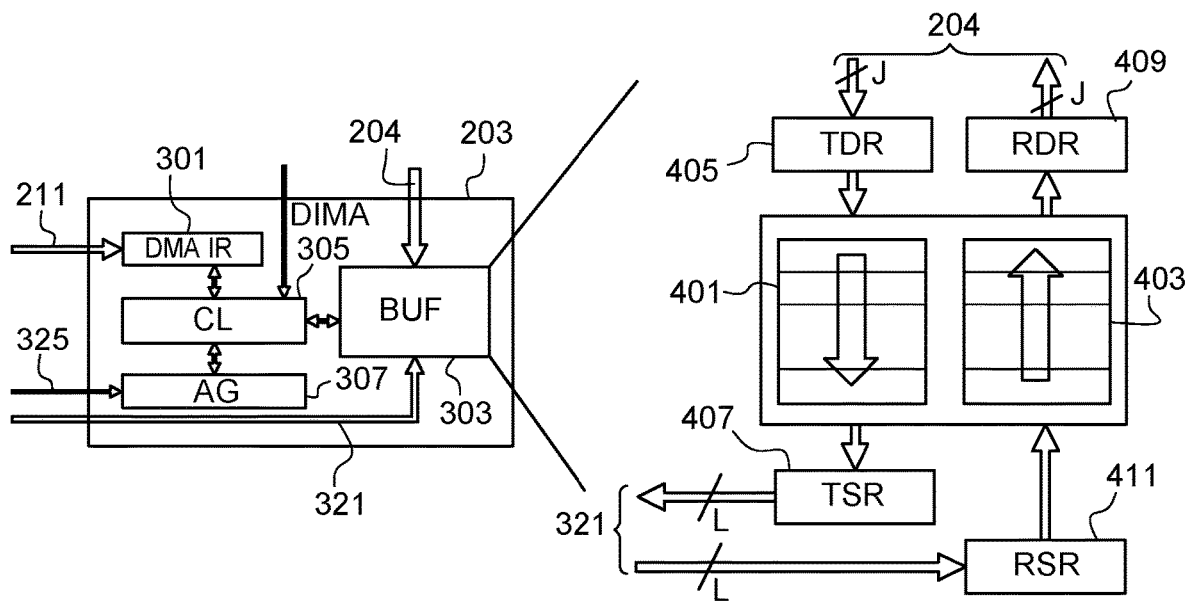
FIG. 4 shows an example of embodiment of a data transfer circuit of the memory module of FIG. 3.

FIG. 4 shows in further detail an example of embodiment of the direct data access circuit 203 of the memory module 200 of FIG. 3.

More particularly, in FIG. 4, an example of embodiment of the buffer circuit 303 of circuit 203 has been shown in further detail (in the right-hand portion of the drawing).

In this example, buffer circuit 303 comprises two unidirectional transfer circuits 401 and 403 of FIFO ("First In First Out") type. Circuit 401 is adapted to transmitting data from the memory circuit 201 of module 200 to memory system bus 251. Circuit 403 is adapted to transmitting data from memory system bus 251 to memory circuit 201. Circuit 401 comprises an input port coupled to an output port of memory circuit 201 (not shown in FIG. 4), via internal link 204. In this example, a data transmission register 405 (TDR) forms an interface between link 204 and the input port of circuit 401. Circuit 401 further comprises an output port coupled to memory system bus 251, via link 321. In this example, a data transmission register 407 (TSR) forms an interface between the output port of circuit 401 and link 321. Circuit 403 comprises an output port coupled to an input port of memory circuit 201, via internal link 204. In an example, a data transmission register 409 (RDR) forms an interface between the output port of circuit 403 and link 204. Circuit 403 further comprises an input port coupled to memory system bus 251, via link 321. In this example, a data transmission register 411 (RSR) forms an interface between link 321 and the input port of circuit 403.

Circuits 401 and 403 enable to temporarily store the data during their transfer from memory circuit 201 to memory system bus 251 or from memory system bus 251 to memory circuit 201. More generally, any other layout of buffer circuit 303 adapted to fulfilling this function may be provided.

Buffer circuit 303 may further have a function of adaptation of the size of the data between link 204 and link 321. As an example, link 204 may have a data width J, link 321 may have a data width L, and memory system bus 251 may have a data width I, with J, L, and I integers greater than 1. Width J may be equal to width L. As a variant, width J may be different from width L. In this case, buffer circuit 303 is configured to adapt the size of the transmitted data. For example, width J may be greater than width L. The adaptation of the size of the data may be performed by registers 405, 407, 409, and 411. As an example, registers 409 and 411 may be shift registers. Further, width I may be equal to width L, or different from width L. As an example, width I is smaller than width L. The adaptation of the size of the data (serialization) between link 321 and memory system bus 251 may be performed by interface circuit 241a.

As a non-limiting example, width J is equal to 2,048 bits, width L is equal to 512 bits, and width I is equal to 128 bits.

The width of the words of buffers 401 and 403 is for example equal to width J, or to width L.

As an example, during a data transmission from memory system bus 251 to memory circuit 201, buffer 403 is successively filled with sub-words of width L until a full word of width J is available to be transmitted to memory circuit 201 via link 204. During a data transmission from memory circuit 201 to memory system bus 251, buffer 401 is read in sub-words of width L, successively transmitted to memory system bus 251 via link 321.

From the programming point of view, the direct access circuit 203 of module 200 is controlled by processor 231 via state registers 301. Dedicated instructions are used to control data transfers via circuit 203.

Write accesses to the memory circuit 201 of module 200, for example, to transfer data from external memory circuit 253 to memory circuit 201, via interface circuit 241a and direct access circuit 203, may be implemented as follows. First, processor 231 writes a full transfer instruction into the instruction registers 301 of circuit 203 via interface circuit 233b and circuit 207 of distribution of the instructions of module 200. The instruction particularly comprises the source address of the data to be transferred (that is, the address of the data in external memory 253), the size of the data block to be transferred, the destination address of the data to be transferred (that is, the address of the data in memory circuit 201), and, possibly, an instruction for rearranging the data during the transfer. The logic control circuit 305 of circuit 203 decodes the instruction and generates a request for accessing in read mode to memory circuit 253 at the specified source address (supplied by address generator 307). This request is sent by the interface circuit 241a of module 200 to the interface circuit 255a of external memory circuit 253, via memory system bus 251. When the source data are ready, external memory circuit 253 sends all the required data, for example, in a continuous burst, directly into the buffer circuit 303 of circuit 203, via interface circuits 255a and 241a and memory system bus 251. The data are then transferred from buffer circuit 303 to memory circuit 201, via the internal link 204 of module 200, when arbitration circuit 309 authorizes this transfer. This transfer may be a continuous transfer as the data are made available at the output of buffer circuit 303. As a variant, it may be waited for all the data to be available in buffer circuit 303 to perform the transfer to memory circuit 201. The selection of the transfer mode may be performed according to a possible operating frequency difference between external memory circuit 253 and the memory circuit 201 of module 200. During the transfer, the destination addresses are communicated to the control circuit 205 of memory circuit 201 by arbitration circuit 309. When the execution of the transfer instruction is over, an interrupt is returned by control circuit 305 to the processor.

Read accesses to the memory circuit 201 of module 200, for example, to transfer data from memory circuit 201 to external memory circuit 253, via the direct access circuit 203 of module 200 and interface circuit 241a, may be performed according to a path inverse to what has been described. Processor 231 first writes the complete instruction into the instruction registers 301 of circuit 203, via interface circuit 233b and circuit 207 for distributing the instructions of module 200. The logic control circuit 305 of circuit 203 decodes the instruction and generates a request for a read access to memory circuit 201 at the specified source address. This request is transmitted to memory circuit 201 via arbitration circuit 309 and control circuit 205. The data are then transferred from memory circuit 201 to buffer circuit 303 via link 204. The content of buffer circuit 303 is then transferred to the destination address of external memory circuit 253, via link 321, interface circuit 241a, memory system bus 251, and interface circuit 255a.

In the system of FIG. 3, accesses to the data of the memory circuit 201 of module 200 may also be directly performed by processor 231 or processor system bus 239, via link 233 and in particular via interface circuit 233b. For example, data may be transferred from external memory circuit 253 to the memory circuit 201 of module 200 by transiting, in the order, through: memory system bus 251, a system interconnection circuit 361 coupling bus 251 to the processor system bus 239 of the processor, processor system 239, interface circuit 233c, interface circuit 233b, distribution circuit 207, and control circuit 205. To transfer data from memory circuit 201 to external memory circuit 253, the inverse path may be used. Such transfers may however be relatively long and block the access to the processor for a significant time period. An advantage of direct access circuit 203 is to allow direct data transfers from or to memory circuit 200, without blocking the access to the processor.

Figure 5:
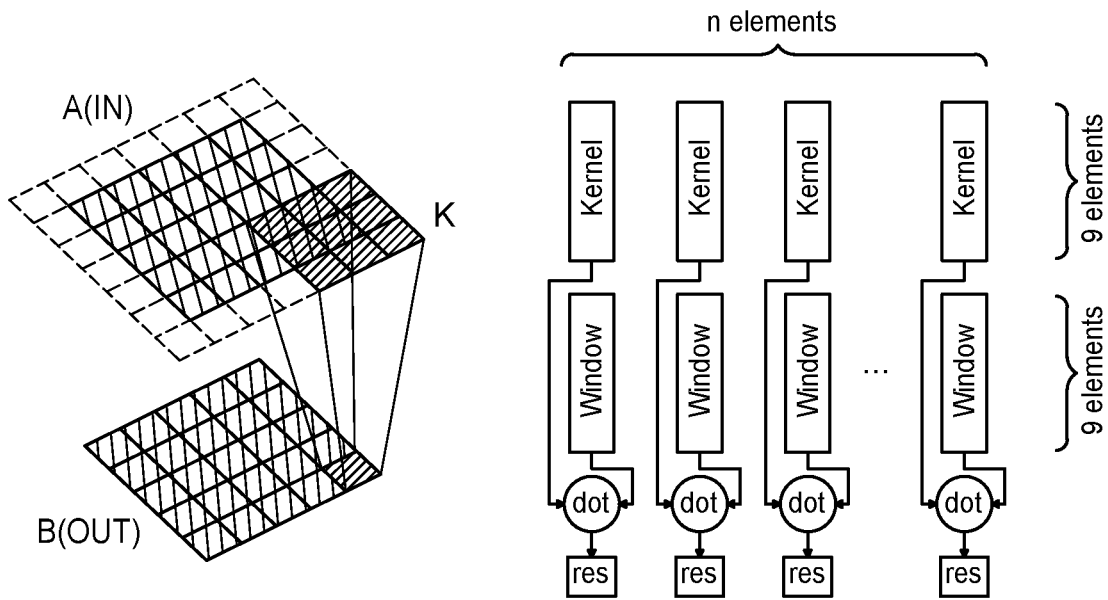
FIG. 5 schematically illustrates an example of a processing capable of requiring a reorganization of the data in a memory circuit.

FIG. 5 schematically illustrates an example of a data processing operation capable of being implemented in a system of the type described in relation with FIGS. 1 to 4.

In this example, the considered processing is an operation of convolution of an input array A(IN) by a convolution kernel K, generating an output array B(OUT).

In the shown example, input array A(IN) is an array of 5×5 values, the convolution kernel is an array of 3×3 values, and output array B(OUT) is an array of 5×5 values. The described embodiments are of course not limited to this specific example. In particular, in practice, arrays A and B may have much larger dimensions. As an example, array A may correspond to an image of from several thousand to several million values.

The left-hand portion of FIG. 5 is an array representation of the input and output data and of the convolution kernel.

The right-hand portion of the drawing shows the data stored according to a pattern adapted to a processing of the convolution operation by a vector calculation unit, with no data rearrangement.

In this example, the values of the convolution filter are stored in a column vector (Kernel) of 9 values (9 elements) identically repeated n times (n elements), where n designates the number of convolution products necessary to perform the complete convolution operation, that is, n=25 in the considered example.

Further, for each element of input array A(IN), the values of the sub-array of 3×3 elements centered on the considered element are stored in a column vector (Window) of 9 values (9 elements). For the peripheral elements of the input array, default filling values may be used to complete the corresponding sub-arrays.

In this example, the n convolution products (sum of the values of an input data vector (Window) weighted by the values of the convolution kernel (Kernel)) are performed in parallel by respectively n computing circuits (dot) of multiplier accumulator type. The result (res) of each convolution product defines a value of output array B(OUT).

In this example, the computing is performed row by row, by a memory circuit adapted to implementing computing operations. As an example, the first row of the column vectors (Kernel) and the first row of the column vectors (Window) are read, a point by point multiplication of the two read row vectors of n elements is performed, and the result is stored (that is, a row vector of n elements). As an example, the first row of the column vectors (Kernel) and the first row of the column vectors (Window) are read, a pointwise multiplication of the two read row vectors of n elements is performed, and the result is stored (that is, a row vector of n elements). These operations are repeated for each of the rows of the column vectors (Kernel) and of the column vectors (Window).

More generally, the described embodiments are particularly advantageous to implement calculations of SIMD ("Single Instruction Multiple Data") type, that is, where a same operation, or operation sequence, is repeated in parallel from different data.

In a system of the type described in relation with FIGS. 1 to 4, it may be desirable to transfer the data from external memory circuit 253 of memory 201, for the execution of calculations of convolution products in memory 201. During the transfer, it is desirable for the data to be rearranged to pass from an array layout (such as shown in the left-hand portion of FIG. 5) in external memory circuit 253, to a column layout (such as shown in the right-hand portion of FIG. 5) in memory circuit 201.

For this purpose, and to limit the occupancy of the processor, direct access circuit 203 (DIMA) is preferably adapted to rearranging the data according to a predefined order during the implementation of a transfer from memory circuit 253 to memory circuit 201, or conversely.

The rearrangement order may then be transmitted to direct access circuit 203 by processor 231, via the dedicated set of instructions used by the processor to control direct access circuit 203.

Figure 6:
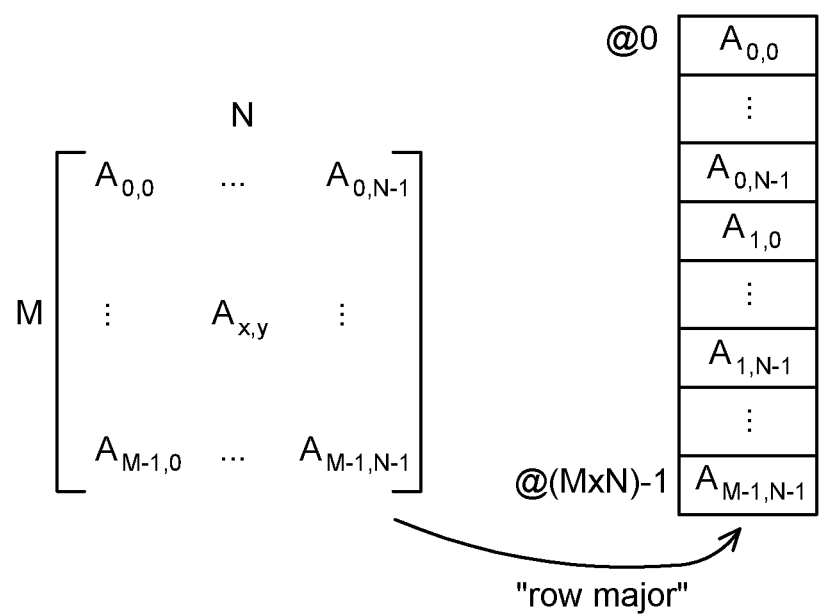
FIG. 6 illustrates an example of layout of the values of the pixels of an image in a memory circuit.

FIG. 6 illustrates in further detail an example of layout of the data in external memory circuit 253.

In this drawing, there has been shown an array A of M rows by N columns, for example corresponding to the array A of FIG. 5, with any dimensions M and N (M and N integers greater than 1). In the left-hand portion of the drawing, there have been shown the values $A_{x,y}$ of the array according to an array layout (with x an integer in the range from 0 to M−1 designating the rank of the row to which value $A_{x,y}$ belongs and y an integer in the range from 0 to N−1 designating the rang of the column to which value $A_{x,y}$ belongs).

In practice, the data are not stored according to this layout within memory circuit 253, but are stored according to a predefined layout, for example, of "row-major" or "column major" type. As an example, all the values $A_{x,y}$ of array A are stored at consecutive addresses in memory circuit 253 from an address @0, according to a predefined path order in array A.

The right-hand portion of FIG. 6 shows the storage of the M*N values $A_{x,y}$ of the array in memory circuit 253, from an address location @0. In an example, values $A_{x,y}$ are stored according to a "row major" type layout, that is, starting from value $A_{0,0}$, by running through each row from left (y=0) to right (y=N−1) and by successively running through the different rows from top (x=0) to bottom (x=M−1). For each new value, the corresponding address in memory circuit 253 is incremented by one location. This enables for all the values $A_{x,y}$ of the array to be stored at consecutive locations in memory circuit 253. This eases the access to the data in the memory circuit and particularly allows an electric power consumption gain.

If the size of each value $A_{x,y}$ is different from the size of a data word in memory circuit 253, the incrementation of the addresses may be accordingly adapted. For example, if the size of values $A_{x,y}$ is equal to twice the size of a data word in memory circuit 253, the address will be incremented by two locations for each new value $A_{x,y}$. In another example, if the size of values $A_{x,y}$ is equal to half the size of a data word in memory circuit 253, two consecutive values $A_{x,y}$ may be stored in each memory location. Thus, the address will be incremented by one location every two values $A_{x,y}$.

Knowing the address @0 of the first value $A_{0,0}$ of the array, the address $\text{Addr}(A_{x,y})$ of each value $A_{x,y}$ of the array may be determined by the following formula:

$$\text{Addr}(A_{x,y}) = @0 + EL\_SIZE*(x*N+y),$$

where EL_SIZE designates the size of values $A_{x,y}$ in number of data words of memory circuit 253 (for example EL_SIZE=2 if values $A_{x,y}$ have a size double that of a data word in memory circuit 253, or EL_SIZE=½ if values $A_{x,y}$ have a size half that of a data word in memory circuit 253).

Similarly, at the end of a processing operation, the data of the resulting array (array B in the example of FIG. 5), may be rewritten according to a layout of the same type in memory circuit 253.

Figure 10:
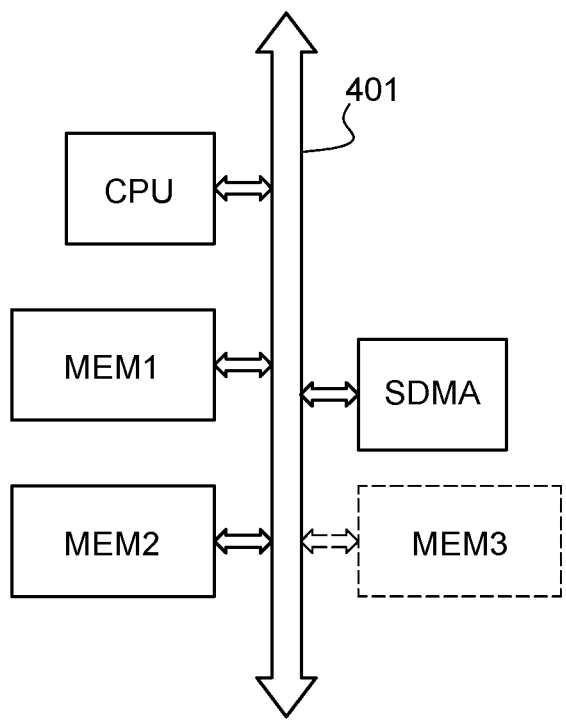
FIG. 10 schematically shows an example of a data transfer system according to an embodiment.

FIG. 7 schematically illustrates an example of a set of instructions used by the processor to control direct access circuit 203 in the system of FIG. 2, or in a more generic system such as described hereafter (FIG. 10 in particular). These instructions may be sent to direct access circuit 203 by the processor via distribution circuit 207, or an equivalent circuit.

In this example, a set of five instructions has been defined. Each instruction comprises a first field (Opcode) containing an operation code, defining the type of instruction to be executed, and a second field (Parameters) containing parameters of the instruction.

The set of instructions of FIG. 7 comprises an instruction SET_REGION of definition of a sub-region of external memory circuit 253, containing the data to be transferred or intended to receive data according to the transfer direction. The sub-region is an area of memory 253 containing (or intended to contain) an array of values ordered, for example, in a "row major" type layout such as described in relation with FIG. 6. In this example, the sub-region is defined by a base address, corresponding, for example, to the location of the first element of the array (address @0 of value A0,0 in the example of FIG. 6), by the size of the elements of the array, and by the number of elements per row in the array (number N of columns in the example of FIG. 6).

The parameter field of instruction SET_REGION comprises a first sub-field (BASE_ADDR) containing the address of the first element of the sub-region (for example, address @0 in the example of FIG. 6), a second sub-field (EL_SIZE)) containing the size of the elements of the array defining the sub-region (for example 1 if the size of the elements of the array is equal to the size of a word in memory 253), and a third sub-field (R_WIDTH) containing a value defining the width of the array (for example the number N of columns of the array in the example of FIG. 6).

As explained hereabove in relation with FIG. 6, based on these parameters, the address of any element of position x,y in the array sub-region defined by instruction SET_REGION may be determined by formula $\text{Addr}(x,y) = \text{BASE\_ADDR} + EL\_SIZE*(x*N+y)$. Thus, once the sub-region has been defined by means of instruction SET_REGION, it is sufficient, to access any element of the sub-region, to transmit to direct access circuit 203 only the coordinates x,y of the element in array A, and not the complete address of the element in memory 253.

The set of instructions of FIG. 7 further comprises an instruction READ_TRANSFER for controlling an asynchronous data sequence transfer from the sub-region of external memory 253 (also called source memory), previously defined by means of instruction SET_REGION, to the destination memory, here memory CSRAM 201. Instruction READ_TRANSFER takes as parameters an elementary data pattern (layout) to be transferred from the source memory to the destination memory. A plurality of iterations of the pattern may be transferred from the source memory to the destination memory, with a predefined reading offset and a predefined writing offset between two consecutive pattern transfer iterations. In other words, the data sequence may comprise a plurality of iterations (or repetitions) of transfer of a same elementary pattern, located at distinct locations, regularly spaced apart, in the sub-region of the source memory previously defined by means of instruction SET_REGION.

The parameter field of instruction READ_TRANSFER comprises a first sub-field (X pos) and a second sub-field (Y pos) containing the coordinates, in the sub-region previously defined in the source memory circuit by instruction SET_REGION, of a first reference cell of the data sequence to be transferred. The address defined by sub-fields (X pos) and (Y pos) is a relative address in the sub-region previously defined by means of instruction SET_REGION (coordinates x and y in the array representation of the sub-region). Thus, the weight (number of bits) used to transmit this address is smaller than the number of bits necessary to code the complete address of the cell in the source memory.

The parameter field of instruction READ_TRANSFER further comprises a third sub-field (IMC address) defining the initial write address of the sequence in the destination memory circuit. It should be noted that the address defined in this third sub-field may be a relative address, the addressing field of the destination memory circuit being known by the direct access circuit. For example, the direct access circuit is associated with the destination memory circuit either due to its hardware positioning close to this memory circuit or due to a configuration of the direct access circuit by means for example of a register of configuration of the direct access circuit which is accessible to the external processor, the direct access circuit knowing, due to this association, the system address range enabling to access the smart memory circuit via a system bus comprising an address bus. Field IMC address contains the relative coordinates, in this system address range dedicated to the destination memory circuit, of a reference cell used as a starting point for the writing of data into the destination memory circuit. This enables to limit the number of bits to be transmitted to define the destination address of the data sequence to be transferred.

The parameter field of instruction READ_TRANSFER further comprises a fourth sub-field (Src off.) defining the offset, in read mode, in the source memory, between two consecutive iterations of the elementary pattern to be transferred.

The parameter field of instruction READ_TRANSFER further comprises a fifth sub-field (Dst off.) defining the offset, in write mode, in the destination memory, between two consecutive iterations of the elementary pattern to be transferred.

The parameter field of instruction READ_TRANSFER further comprises a sixth sub-field (Length) defining the number of iterations of the elementary pattern to be transferred from the source memory to the destination memory.

In this example, the parameter field of instruction READ_TRANSFER further comprises a seventh sub-field (Pattern) defining the shape of the elementary pattern to be transferred, that is, the spatial arrangement of the data of the pattern in the source memory around a reference point. The elementary pattern is scanned and transferred according to a predefined reading order. The data of the elementary pattern are rearranged, for example in one or a plurality of rows or in one or a plurality of columns, during their writing into the destination memory circuit. The choice of the layout in the destination memory circuit depends on the organization of the data in the destination memory circuit to allow the implementation of calculations.

The parameter field of instruction READ_TRANSFER may further comprise an eighth sub-field (Op. mode) defining whether the writings performed keep, partially or not, the data initially stored in the write region of the destination memory when the fourth sub-field (Dst off.) is different from 1, in other words greater than or equal to 2. In a first operating mode also called "zero padding", the data straddled, during the writing, by the application of the offset defined in the fourth sub-field (Dst off.), are replaced with zeroes. In a second operating mode, also called "overwriting mode", the data straddled, during the writing, by the application of the offset defined in the fourth sub-field (Dst off.) are kept as such.

The set of instructions of FIG. 7 further comprises an instruction WRITE_TRANSFER for controlling an asynchronous data sequence transfer in the reverse direction to what has just been described. Thus, in this example, the source memory is CSRAM memory 201 and the destination memory is external memory 253. Similarly to what has just been described, instruction WRITE_TRANSFER takes as parameters an elementary pattern (layout) of data to be transferred from the source memory to the destination memory. A plurality of iterations of the pattern may be transferred from the source memory to the destination memory, with a predefined reading offset and a predefined writing offset between two consecutive iterations of the pattern.

The parameter field of instruction WRITE_TRANSFER comprises a first sub-field (X pos) and a second sub-field (Y pos) defining the initial write address of the sequence in the destination memory. Here again, the address defined by sub-fields (X pos) and (Y pos) is a relative address in the sub-region of the destination memory previously defined by means of instruction SET_REGION (coordinates x and y of the element in the array area defined by instruction SET_REGION). Thus, the weight (number of bits) used to transmit this address is smaller than the number of bits of the complete address of the cell in the source memory.

The parameter field of instruction WRITE_TRANSFER comprises a third sub-field (IMC address) defining the initial read address of the sequence in the source memory circuit. As previously described, this address is a relative address, the address sub-range of the source memory circuit being known by the direct access circuit.

The parameter field of instruction WRITE_TRANSFER further comprises a fourth sub-field (Dst off.) defining the offset, in write mode, in the destination memory, between two consecutive iterations of the elementary pattern to be transferred.

The parameter field of instruction WRITE_TRANSFER further comprises a fifth sub-field (Src off.) defining the offset, in read mode, in the source memory, between two consecutive iterations of the elementary pattern to be transferred.

The parameter field of instruction WRITE_TRANSFER further comprises a sixth sub-field (Length) defining the number of iterations of the elementary pattern to be transferred from the source memory to the destination memory.

The parameter field of instruction WRITE_TRANSFER further comprises a seventh sub-field (Pattern) defining the shape of the elementary pattern to be transferred, that is, the spatial arrangement of the data of the pattern in the source memory circuit.

The parameter field of instruction WRITE_TRANSFER may further comprise an eighth sub-field (Op. mode) defining whether the writings performed keep, partially or not, the data initially stored in the write region of the destination memory when the fourth sub-field (Dst off.) is different from 1, in other words, greater than or equal to 2 (operating modes of "zero padding" or "overwriting" type such as defined hereabove).

The set of instructions of FIG. 7 may further comprise an instruction BLOCKING_WAIT to block the execution of the host until an ongoing transfer is over.

The set of instructions of FIG. 7 may further comprise an instruction COPY of control of an internal data transfer from a first location to a second location in CSRAM memory 201, which is then both the source memory and the destination memory. Here again, instruction COPY takes as parameters an elementary pattern (layout) of data to be transferred. A plurality of iterations of the pattern may be transferred from the source memory to the destination memory, with a predefined reading offset and a predefined writing offset between two consecutive iterations of the pattern.

The parameter field of instruction COPY comprises a first sub-field (IMC address 1) defining the initial read address of the sequence in memory 201.

The parameter field of instruction COPY comprises a first sub-field (IMC address 2) defining the initial read address of the sequence in memory 201.

The parameter field of instruction READ_TRANSFER further comprises a fourth sub-field (Src off.) defining the offset, in read mode, in the source memory, between two consecutive iterations of the elementary pattern to be transferred.

The parameter field of instruction COPY further comprises a fourth sub-field (Dst off.) defining the offset, in write mode, in the memory, between two consecutive iterations of the elementary pattern to be transferred.

The parameter field of instruction COPY further comprises a fifth sub-field (Length) defining the number of iterations of the elementary pattern to be transferred into memory 201.

The parameter field of instruction COPY further comprises a sixth sub-field (Pattern) defining the shape (spatial arrangement of the data in the memory) of the elementary pattern to be transferred. It should be noted that the data of the elementary pattern may be rearranged, for example in one or a plurality of rows, or in one or a plurality of columns or according to any other desired pattern, during their rewriting into the memory (according to the layout necessary to perform calculations, for example, of SIMD type).

The parameter field of instruction COPY may further comprise a seventh sub-field (Op. mode) defining whether the writings performed keep, partially or not, the data initially stored in the write region of the destination memory, when the fourth sub-field (Dst off.) is different from 1, in other words greater than or equal to 2.

In this example, instruction SET_REGION enables to define a region of interest in external memory 253, generally of large dimensions, before executing transfer instructions READ_TRANSFER and/or WRITE_TRANSFER. As an example, the region of interest corresponds to an input image or array (A in the example of FIG. 5) or an output array (B in the example of FIG. 5) stored according to a predefined pattern, for example, of "row major" type, in memory 253. After a transfer operation READ (to transfer the elements of array A into calculation memory 201), it is desired to apply a processing, for example convolutional, due to the computing means of CSRAM memory 201, to generate the elements of a result array or output array (B in the example of FIG. 5). In practice, the calculations in CSRAM 201 are initiated by an instruction sent by CPU 231 to the CSRAM. This or these computing instruction(s) advantageously provide for the elements of this result array B to be stored in CSRAM 201 at the end of the computing operations. More particularly, the CPU asks the CSRAM, via its computing instructions, to write the elements of array B into CSRAM 201 by for example storing them according to the "row major" storage configuration, to obtain a storage of array B similar to that shown for array A in FIG. 6, the elements of array B being placed at consecutive addresses of memory 201. Once the elements of array B have been stored in CSRAM 201, it is then possible to perform a transfer of these elements from external memory 253, due to the implementation of instruction WRITE_TRANSFER. The operation of WRITE_TRANSFER to external memory 253 may consist of a simple transfer of the "data block" forming array B stored at consecutive addresses (number of addresses: M*N elements*EL_SIZE) to another "block of destination data" stored in consecutive addresses of external memory 253. To perform this "simple transfer", it is possible to start an operation WRITE TRANSFER with a simple pattern comprising a single element. It can also be defined by convention that a field Pattern equal to "0" corresponds to a simple transfer with no data rearrangement.

As a variant, it is possible, after the calculation of array B, stored in the CSRAM, for it to be in practice desired to perform a calculation on this array B to generate an array C. Instruction COPY may then be used to start a data transfer consisting of rearranging the elements of array B in CSRAM memory 201 to organize them for example in columns or in rows according to the layout of the computing operators (at the foot of columns or of rows). Once instruction COPY has been carried out, CPU may launch an instruction of calculation in the CSRAM to obtain the data constitutive of array C. As previously described for the data of array B, the data of array C may then, on request of the CPU to the CSRAM, be stored at consecutive addresses, with a "row major" storage. The elements of this array C may then be possibly transferred to external array 253 if no further calculation is desired to be performed on these elements in CSRAM 201.

It should be noted that the "complex" patterns are defined from a plurality of elements to be recovered from the source memory around a central element, conversely to this "simple" pattern only comprising an element to be recovered from the source memory. The element to be recovered is a piece of data having a number of bits defined by parameter EL_SIZE. It should be noted that this parameter EL_SIZE is defined in instruction SET_REGION. Thus, if EL_SIZE is defined in relative fashion, the size of a data word of the memory concerned by instruction SET_REGION has to be considered to know the number of bits of EL_SIZE. As a variant, parameter EL_SIZE may be defined in absolute fashion directly by a number of bits.

The previously described set of instructions comprising an instruction of SET_REGION type and at least one transfer instruction (READ, WRITE) enables to compress the total weight of the instruction parameters to be sent to direct access circuit 203 to execute the transfers from memory 253 to memory 201 and/or from memory 201 to memory 253. Once the region of interest has been defined by means of instruction SET_REGION, relative positions in the region of interest may be used as parameters in instructions READ_TRANSFER and WRITE_TRANSFER. This enables to decrease the number of required bits, in the instructions sent by the processor to the direct access circuit, to define the addresses of the data to be transferred into memory 201, in particular when a plurality of successive instructions READ_TRANSFER and/or WRITE_TRANSFER are executed in a same sub-region between two successive executions of instruction SET_REGION.

It should be noted that the parameter field of instruction SET_REGION may comprise one or a plurality of additional bits enabling to define a plurality of sub-regions of interest, for example, a read sub-region, for transfers from memory 253 to memory 201, and a write sub-region, distinct from the read sub-region, for transfers from memory 201 to memory 253. Thus, direct access circuit 203 may comprise in practice a plurality of registers storing the parameters of instruction SET_REGION for one or a plurality of READ-type operations or one or a plurality of WRITE-type operations. Similarly, instructions READ and WRITE may comprise one or a plurality of additional bits enabling to define type-1 or type-2 (or n) READ operations, and type-1, type-2 (or n) WRITE operations. It may thus for example be provided to store a plurality of operations BASE_ADDR for each READ and/or WRITE operation likely to be required by the processor after one or a plurality of initial instructions SET_REGION enabling to define the data areas in the external memory, or another memory, which will have to be considered on execution of the subsequent READ or WRITE operations.

The use of dedicated instructions of the type described in relation with FIG. 7, decoded by a control circuit internal to direct access circuit 203, advantageously enables to decrease the time and the number of processor cycles necessary to transmit transfer instructions to direct access circuit 203. This decrease particularly results from the address compression made possible by the definition, via instruction SET_REGION, of a sub-region of interest (containing or intended to contain the data of an array) in the source or destination memory circuit, but also due to the fact that the addressing of CSRAM memory circuit 201 is performed in relative fashion, in an address sub-range known by the direct access circuit.

FIG. 8 schematically illustrates the execution of a data transfer operation in the system of FIG. 2, for example defined by an instruction READ_TRANSFER of the set of instructions of FIG. 7.

There has been shown in the left-hand portion of the drawing a sub-region of interest previously defined in source memory 253 by means of instruction SET_REGION. In FIG. 8, the sub-region is shown in array form (array of M rows by N columns), it being understood that, in practice, the storage of the values of the array in memory 253 may be performed according to a different layout, for example, a layout of consecutive address cells in the memory, for example, a layout of "row major" type.

In this example, it is desired to transfer three iterations of an elementary pattern in the form of an array of 3*3 elements (in the array representation of the left-hand view of FIG. 8), for example, to perform three operations of matrix multiplication by a same convolution kernel. The convolution kernel here forms the (complex) pattern which is desired to be used for the transfer.

As previously discussed in relation with FIG. 5, it is here desired to transfer each iteration of the elementary pattern by rearranging the data of the pattern in a column vector coupled to an elementary multiplication-accumulation operator 801 (in the right-hand portion of the drawing). In the shown example, memory circuit 201 has eight multiplication-accumulation operators. Only three operators are used in this example (the first three, starting from the left), since only 3 convolutions are desired to be transferred and calculated. 3 transfer iterations are thus performed according to the pattern corresponding to the convolution kernel. As a reminder, the number of iterations of the pattern which is desired to be transferred is defined by parameter Length.

Each iteration of the elementary pattern in the work sub-region of memory 253 is defined from a reference cell associated with this iteration, for example, the central cell of the elementary pattern in its array representation. In FIG. 8, the reference cells of three successive iterations of the pattern which is desired to be transferred have respectively been designated as $S1_R$, $S2_R$, and $S3_R$. The address X pos, Y pos transmitted to direct access circuit 203 via instruction READ_TRANSFER for example corresponds to the address of the reference cell SIR of the first iteration of the elementary pattern to be transferred (relative address in the work sub-region defined by instruction SET_REGION). In this example, the parameter Length of instruction READ_TRANSFER is equal to 3 (the data sequence to be transferred comprises three iterations of the elementary pattern). Field IMC address for example defines the write address, in destination memory 201, of the first cell of the first iteration of the elementary pattern. Parameter Src off. defines the pitch, in number of elements (of size EL_SIZE), between two successive iterations of the elementary pattern in source memory 253, that is, the address offset, in source memory 253, between cell $S1_R$ and cell $S2_R$, and between cell $S2_R$ and cell $S3_R$ (Src off.=1 in the shown example). Parameter Dst off. defines the pitch, in number of elements, between two successive iterations of the elementary pattern in destination memory 201 (Dst off.=1 in the shown example) on a same data row in the CSRAM memory (if the calculation operators are aligned with the columns). The elementary pattern of the sequence (array of 3*3 elements in this example) is defined by the parameter Pattern of instruction READ_TRANSFER.

In FIG. 8, there has been respectively shown in black, in hatchings, and in dotted lines, the first cell of each of the three iterations of the pattern (the first cell of the pattern corresponding to that "at the top left" in this example). For each iteration of the pattern, the next cells of the pattern are written into the same column as the first cell of the pattern, respectively in front of three of the eight computing operators 801.

It should be noted that writings into the first row (corresponding to the first cell of each iteration of the pattern) of the CSRAM memory are performed by a simple address increment (unit if EL_SIZE corresponds to the size of a word of CSRAM 201) between each writing. The same applies for writings into the second row (corresponding to the second cell of each iteration of the pattern). However, between the writing of the 3rd piece of data of the first row and the writing of the 1st piece of data of the second row, it is necessary to perform an "address hopping" corresponding in this example to a 5-address hopping. The length of this address hopping may be defined in a parameter SEQ_OFF capable of being predefined knowing the organization of the CSRAM memory (the organization of its memory address mapping) and knowing the number of columns associated with a computing operator which is desired to be used, and here defined from parameter Length.

It should be noted that in the case where parameter Length is larger than the number of operators available in the CSRAM memory, it is possible to use a plurality of rows a, b, c . . . , preferably successive (particularly in terms of addressing), to store all the first elements of each of the iterations of the pattern, and likewise for all the second elements of the iterations of the pattern, and so on. The computing operators will then be successively used to perform the desired calculation from rows "a", and then from rows "b", then rows "c", and so on.

Figure 9:
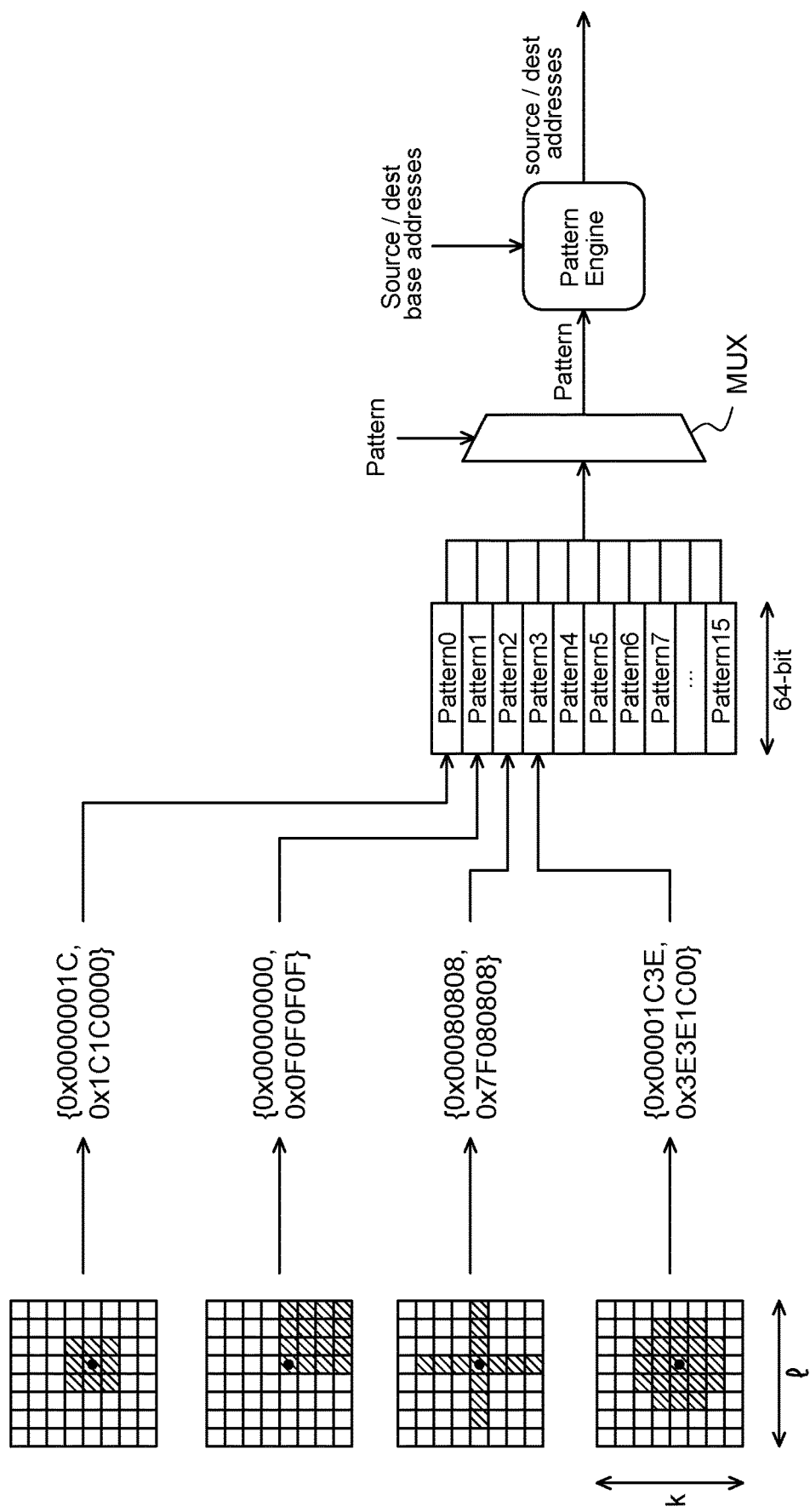
FIG. 9 schematically and partially shows an example of implementation of a circuit for controlling the data transfer circuit of the system of FIG. 2.

FIG. 9 schematically and partially shows an example of implementation of a circuit for controlling the direct data access circuit 203 of the system of FIG. 2.

FIG. 9 more particularly illustrates an example of a mechanism of generation of the addresses in the source memory and the destination memory by the direct access circuit 203 of the system of FIG. 2.

This mechanism is for example implemented by control circuit 305 and/or address generation circuit 307 in the example of implementation of FIG. 3.

In the example of FIG. 9, a plurality of predefined elementary patterns are stored in the form of bit sequences in an internal memory of direct access circuit 203, for example, a RAM ("Random Access Memory") memory or a ROM ("Read Only Memory") memory.

The elementary patterns are all defined in a same elementary predefined array of dimensions k*l (with k and l integers and with, preferably k and/or l greater than or equal to 2). Dimensions k and l are for example smaller respectively than dimensions M and N of the array sub-region defined by means of instruction SET_REGION. In the shown example, the elementary patterns are all defined in a same elementary array of 8*8 neighboring memory cells (k=l=8), each memory cell corresponding in this example to a data bit.

In this example, each elementary pattern corresponds to a sequence of k*l bits (8*8=64 bits in the shown example) defining, for each cell i among the k*l cells of the predefined elementary array, according to a predefined scanning direction of the elementary array, for example, row after row from bottom to top, and from left to right in each row, whether the cell forms part or not of the elementary pattern to be transferred. The first cell is for example at the top left and the last cell (k*l-th cell) is at the bottom right. Each bit in a first state, for example, a low state, corresponds to a cell which does not form part of the elementary pattern to be transferred, and each bit in a second state, for example, a high state, corresponds to a cell forming part of the elementary pattern to be transferred.

In FIG. 9, several examples of elementary patterns are shown, on the one hand in array form, and on the other hand in the form of a bit sequence (shown in hexadecimal system in the drawing).

In the example of FIG. 9, 16 distinct predefined elementary patterns are stored in direct access circuit 203. The described embodiments are of course not limited to this specific case.

The predefined elementary patterns may be stored once and for all in direct access circuit 203 on design of the system. As a variant, the elementary patterns may be updated by means of a dedicated instruction for controlling direct access circuit 203. As an example, the elementary patterns are stored in a specific memory of direct access circuit 203, this specific memory being mapped to be directly accessible in write mode by the system processor.

When direct access circuit 203 receives a transfer or copy instruction of the type described in relation with FIG. 7 (READ_TRANSFER, WRITE_TRANSFER, COPY), the instruction contains, in sub-field (Pattern), a code, for example over 4 bits in the example considered in FIG. 9, identifying one among the plurality of predefined elementary patterns stored in direct access circuit 203.

Once the instruction has been decoded, the corresponding elementary pattern is selected, according to the transmitted identification pattern (Pattern), for example by means of a multiplexer (MUX).

As a variant, the k*l bits of the elementary pattern are directly transmitted into the field Pattern of the parameters of instruction READ_TRANSFER or WRITE_TRANSFER or COPY.

The selected elementary pattern is transmitted to a pattern generation module (Pattern Engine) or pattern application module, for example, a finite state machine, which also receives as an input the address of the reference cell (represented by a black spot in FIG. 9) of the pattern to be transferred. This module, for example implemented by circuit 305 and/or address generation circuit 307 in the example of implementation of FIG. 3, generates the source addressing sequence and the destination addressing sequence of the pattern to be transferred or more exactly of the iterations of patterns to be transferred such as defined in the parameters of the initiated transfer operation (READ, WRITE, or COPY). The data are then transferred, according to this sequence, by direct access circuit 203.

In this example, the elementary pattern is selected from a list of a plurality of predefined elementary patterns.

During the writing into the destination memory, the data may be written rearranged according to a predefined pattern, for example, in one or a plurality of rows or in one or a plurality of columns in the case where the destination memory is CSRAM 201 and the computing operators are respectively coupled to the columns or to the rows of the CSRAM memory. This for example enables to implement parallelized calculations, for example, of SIMD type, from the data of the destination memory. As an example, each iteration of the elementary pattern in the source memory corresponds to a row vector or to a column vector in the destination memory, similarly to what has been described in relation with FIG. 5 or in relation with FIG. 8.

It should be noted that the data transferred into the destination memory, in the case of a WRITE operation, do not need to be arranged in one or a plurality of rows or columns in the external memory as previously described if no SIMD-type calculation is desired to be performed in this destination memory. The data in the destination memory are however preferably stored according to a "row major" organization to facilitate possible subsequent operations of access to these data.

Among the applications capable of benefiting from the data transfer and rearrangement mechanisms described hereabove, one can mention, as non-limiting examples, array manipulations, data manipulations according to Stencil codes, convolution calculations, convolutional neural networks, etc. Each time, a sequence of a plurality of iterations of any elementary pattern (cross, row, column, array, etc.) is transferred from the source memory to the destination memory, by rearranging each iteration of the pattern in a row vector or a column vector in the destination memory to perform computing operations parallelized in the destination memory.

The implementation of a set of specific instructions enabling to control a direct access circuit closely coupled to a memory circuit adapted to implementing computing operations has been described hereabove. This is an improvement of the system described in French patent application No. FR2014174 filed by the applicant on Dec. 28, 2020 and entitled "Module mémoire adapté à mettre en œuvre des fonctions de calcul", where multiple writings into configuration registers are required to configure the direct access circuit.

More generally, the described embodiments may be applied in any type of direct access circuit (DMA) not necessarily coupled to a memory adapted to implementing computing operations, for example, in a system of the type described hereafter in relation with FIG. 10.

FIG. 10 schematically shows an example of a data transfer system according to an embodiment.

The system of FIG. 10 comprises two memory circuits MEM1 and MEM2, a CPU processor, a so-called "smart" direct access circuit SDMA, and a bus 401. In this example, memory circuits MEM1 and MEM2, processor CPU, and direct access circuit SDMA are all coupled to bus 401. As an example, at least one of memory circuits MPEM1 and MEM2 is adapted to implementing computing functions. The described embodiments are however not limited to this specific case.

As an example, bus 401 may comprise a memory system bus (MSB), similar to the bus 251 (MSB) of the example of FIG. 2, and a processor data bus (CDB), similar to bus 239 (CDB). Memory circuits MEM1 and MEM2 and direct access circuit SDMA are coupled to the memory system bus (MSB) to enable direct access circuit SDMA to control direct data transfers between circuits MEM1 and MEM2 via the memory system bus (MSB).

As an example, direct access circuit SDMA comprises an internal control circuit adapted to controlling data transfers arranged according to complex patterns of the above-described type, from memory MEM1 to memory MEM2 or conversely, with a rearrangement of the data during the transfer defined according to an elementary transfer pattern.

Similarly to what has been described hereabove in relation with FIG. 9, an elementary pattern is defined in an elementary pattern of dimensions k*l, for example, an elementary array of 8*8 neighboring cells. More particularly, the elementary pattern is defined by a sequence of k*l bits indicating, for each cell of the elementary array, whether the content of the cell should be transferred or not. This enables to easily encode complex patterns adapted to all types of application.

As an example, direct access circuit SDMA comprises control registers adapted to receiving the different parameters required for the implementation of the transfers. The parameters may be written by the processor into the control registers via bus 401, preferably via the processor data bus (CDB) of bus 401.

The different control parameters of the direct access circuit are for example:
  SRC_ADDR: the source address of the reference cell of the first iteration of the elementary pattern of the sequence to be transferred (X pos, Y pos in the example of FIG. 7). This parameter is for example stored in a dedicated control register of direct access circuit SDMA, for example, a 32-bit register.
  DST_ADDR: the destination address of the base element of the first iteration of the elementary pattern of the sequence to be transferred (IMC address in the example of FIG. 7). This parameter is for example stored in a dedicated control register of direct access circuit SDMA, for example, a 32-bit register.
  BIT_PATTERN: the sequence of k*l bits defining the elementary pattern of the sequence to be transferred. This parameter is for example stored in one or a plurality of dedicated registers of direct access circuit SDMA, for example, in two registers of 32 bits each for an elementary pattern defined in an elementary array of 8*8 elements.

SEQ_LEN: the length of each sequence, that is, the number of iterations of the elementary pattern in the data sequence to be transferred (Length in the example of FIG. 7). This parameter is for example stored in a dedicated register of the direct access circuit, for example, a 32-bit register.

SEQ_OFF: an additional offset applied in the destination memory between each transfer generated by the device, to ascertain that the data pattern in the destination memory effectively corresponds to that desired by the user, particularly to manage alignment issues. For example, if a transfer of 3 16-bit convolutions is desired to be performed towards a 128-bit destination memory (8×16-bit), the length of sequence SEQ_LEN is equal to 3 and the necessary offset between each transfer is of 5 elements, to correctly align the data (corresponding for example to the case of FIG. 8). This parameter is for example stored in a dedicated register of the direct access circuit, for example, a 32-bit register.

SRC_OFFSET: the offset of the source addresses (that is, in read mode) between two successive iterations of the elementary pattern of the sequence (Src Off. in the example of FIG. 7). This parameter is for example stored in a dedicated register of the direct access circuit, for example, a 32-bit register.

DST_OFFSET: the offset of the destination addresses (that is, in write mode) between two successive iterations of the elementary pattern of the sequence (Dst Off. in the example of FIG. 7). This parameter is for example stored in a dedicated register of the direct access circuit, for example, a 32-bit register.

EL_SIZE: the size of each element of pattern BIT_PATTERN. This parameter is for example stored in a dedicated register of the direct access circuit, for example, a 32-bit register.

ARR_WIDTH: the width of the sub-region of the source memory where the sequence to be transferred (used to generate the addresses from base address SRC_ADDR—corresponding to parameter R_WIDTH in the example of FIG. 7) is located. This parameter is for example stored in a dedicated register of the direct access circuit, for example, a 32-bit register.

TRANSFER_START: a flag for starting the transfer by direct access circuit SDMA. This parameter is for example stored in a dedicated register of the direct access circuit, for example, a 32-bit register.

TRANSFER_DONE: a parameter set to a first state, for example, value 1, when the transfer is over, and to a second state, for example, value 0, as long as the transfer is not over. This parameter is for example stored in a dedicated register of the direct access circuit, for example, a 32-bit register.

Optimizations of the storage of the parameters may be implemented to decrease the number of required configuration registers.

As a variant, the transfer parameters may be transmitted to direct access circuit SMDA by means of a specific set of instructions, for example of the type described in relation with FIG. 7.

As an example, during the execution of a transfer, the elementary array defining an elementary pattern to be transferred is run through in a predefined direction, for example row by row from top to bottom and from left to right in each row.

For each element of the elementary array, if the corresponding bit of parameter BIT_PATTERN is in a first state, for example, a low state, nothing happens.

If however, the corresponding bit of parameter BIT_PATTERN is in a second state, for example, a high state, a transfer is generated. As an example, in this case a set of SEQ_LEN elements (number of pattern iterations) separated two by two by SRC_OFFSET elements is read from the source memory. The SEQ_LEN elements are then written into the destination memory, separated two by two by DST_OFFSET elements. In other words, for each bit in the high state of parameter BIT_PATTERN, SEQ_LEN elements of same position are simultaneously or successively transferred in the SEQ_LEN iterations of the elementary pattern of the sequence to be transferred, before continuing the running through the elementary pattern. For each iteration of the elementary pattern, the address of the current element to be transferred is determined by the direct access circuit from the address of the reference cell of the concerned iteration (itself determined from the address of the reference cell of the first iteration of the pattern, transmitted via field SRC_ADDR (or via fields X Pos, Y Pos)), and from the row and column indexes of the element in the elementary array having the elementary pattern defined therein.

As a variant, in the case of an overlapping of the different iterations of the elementary pattern of the sequence to be transferred, the internal control circuit may advantageously be configured to anticipate redundant data and thus decrease read accesses to the source memory. In this case, for each element of the source memory, direct access circuit SDMA determines whether the element belongs to a plurality of iterations of the elementary pattern in the data sequence to be transferred. If the element is to be written a plurality of times, it is, after its first reading from the destination memory, stored in an internal memory of direct access circuit SDMA. Thus, direct access circuit SDMA can successively rewrite the element a plurality of times without needing to access the source memory. Another possibility comprises starting a reading from the destination memory at the address containing the already-transferred piece of data to "recover" it and copy it, write it, into the concerned destination address.

Designating by S the set of elements of the elementary pattern to be transferred (that is, the subset of the elements of the elementary array of k*l elements for which the corresponding bit of pattern BIT_PATTERN is at state '1'), the dimension size_of (D) of subset S (with size_of(S) <=k*l) defines the number of elements to be transferred of the elementary pattern, also called number of occurrences.

The data transfer from source memory MEM1 to destination memory MEM2 may be executed according to a routine defined in programming language, for example, in C language, or in programming pseudo-language, as follows:

```
for i in [0..size_of(S)-1]:
  for j in [0 .. SEQ_LEN]
    DST_{i,j}=MEM2[DST_ADDR+EL_SIZE*(i*SEQ_LEN+SEQ_OFF)+DST_OFFSET*j]
```

```
SRC_{i,j}=MEM1[SRC_ADDR+EL_SIZE*(S[i].x*ARR_WIDTH+S[i].y+SRC_OFFSET*j]
MEMCPY(DST_{i,j},SRC_{i,j})
end for
end for
```

Parameters S[i]·x and S[i]·y here respectively define the row index and the column index of the i-th element of set S in the elementary array having computing kernel BIT_PATTERN defined therein.

Figure 11:
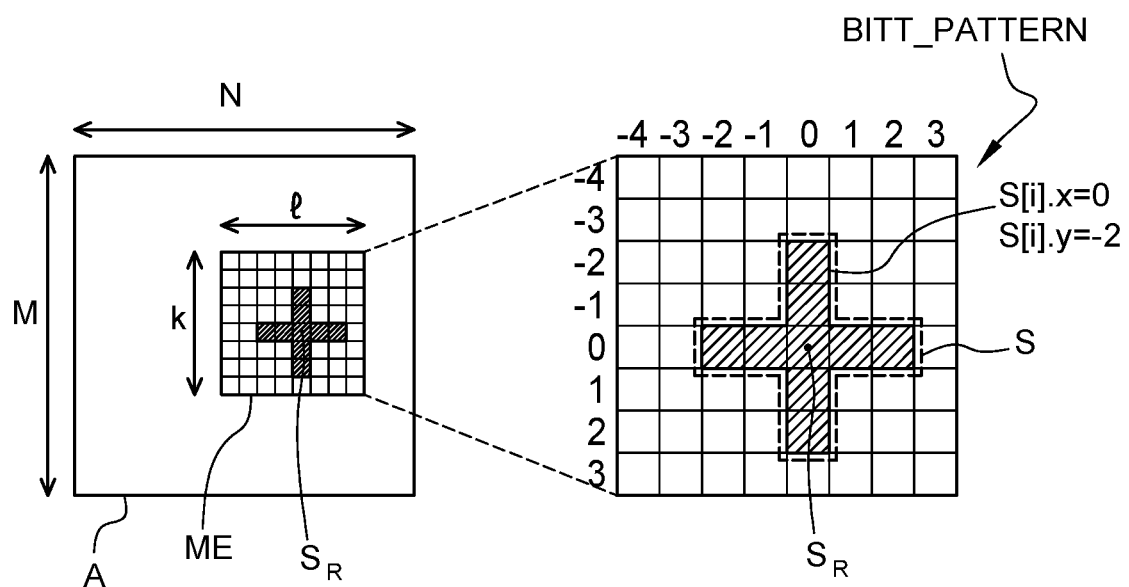
FIG. 11 schematically shows the operation of an example of a transfer system according to an embodiment.

FIG. 11 schematically illustrates the scanning of a data array of dimensions M*N (for example, the array A of FIG. 6) and the selection of the locations of array A to be read by means of the computing kernel or BIT_PATTERN. The data of array A are stored in a sub-region of the source memory circuit comprising a sequence of locations consecutive in terms of addressing, containing the array elements. There has been designated in FIG. 11 with reference ME the elementary array of predefined size k*l, smaller than the size of array A, having the elementary data pattern to be transferred by means of computing kernel BIT_PATTERN defined therein. Array ME enables to identify an elementary array window of array A. Direct access circuit SDMA receives a source address for a first pattern to be transferred, this source address corresponding to the address, in the sub-region (array A), of the reference element SR of the BIT_PATTERN and corresponding to reference data of the data array located at this source address. The other elementary of the BIT_PATTERN are associated with other data of data array A by relative positioning with respect respectively to the reference element of the BIT_PATTERN and to the reference data of said array (indexes S[i]·x and S[i]·y. The direct access circuit is adapted, during the execution of a transfer of an elementary pattern, to recovering the data of said array associated with elements of the BIT_PATTERN having their bit at state '1'.

Optionally, the system of FIG. 10 may comprise at least one third memory circuit MEM3, the direct access circuit being adapted to controlling data transfers indifferently from any of circuits MEM1, MEM2, and MEM3 to another of circuits MEM1, MEM2, and MEM3 or to the same circuit (COPY), according to the above-described mechanisms.

Various embodiments and variants have been described. Those skilled in the art will understand that certain features of these various embodiments and variants may be combined, and other variants will occur to those skilled in the art.

In particular, two main aspects of a system of direct data access between first and second memories have been described hereabove.

According to a first aspect, a sub-region of interest is defined in the first memory and/or in the second memory, by means of a specific instruction of control of the direct access circuit, after which data transfers from the first memory to the second memory or conversely are controlled, by only transmitting to the direct access circuit relative source and/or destination addresses, that is, defined within the sub-region of interest.

According to a second aspect, the direct access circuit is adapted to transferring a data sequence comprising a plurality of iterations of an elementary pattern having its shape defined for a bit sequence BIT_PATTERN defining, for each cell of a predefined elementary array window, whether the cell forms part or not of the elementary pattern to be transferred.

These two aspects enable to compress the parameters to be transmitted to the direct access circuit to control a data transfer from the first memory to the second memory, and thus to limit exchanges between the processor and the direct access circuit.

Those skilled in the art will understand that these two aspects may be implemented independently from each other or in combination according to the needs of the considered application.

Further, although these two aspects are particularly advantageous in the case where one of the two memories of the system is a memory adapted to implementing computing operations, the described embodiments are not limited to this specific case and may be applied to systems comprising conventional memory circuits, for example coupled to external computing units.

Finally, the practical implementation of the described embodiments and variants is within the abilities of those skilled in the art based on the functional indications given hereabove.

What is claimed is:

1. System comprising:
a processor;
a circuit of direct transfer of a data sequence between a source memory circuit and a destination memory circuit without transiting through the processor, a sub-region of the source memory circuit comprising a sequence of consecutive locations in terms of addressing containing the elements of a data array, wherein the direct transfer circuit is adapted to receiving and decoding computing kernel information called BIT_PATTERN of an elementary data pattern to be transferred defined from an elementary array of k*l binary elements, with k an integer greater than or equal to 2 and l an integer greater than or equal to 2, the size of said elementary array being smaller than the size of said data array, the elementary array being intended to identify an elementary array window of said array, each element of the elementary array comprising a bit capable of taking a first or a second state according respectively to whether the element does not belong or belongs to said pattern, the elementary array of the BIT_PATTERN comprising a reference element; the direct transfer circuit receiving a source address for a first pattern to be transferred, this source address corresponding to the address in said sub-region of said reference element of the BIT_PATTERN and corresponding to a reference piece of data of said data array located at this source address, the other elements of the BIT_PATTERN being associated with other data of said array by relative positioning with respect to, respectively, the reference element of the BIT_PATTERN and the reference piece of data of said array; the direct transfer circuit being adapted, during the execution of the transfer of an elementary pattern, to recovering the data of said array associated with elements of the BIT_PATTERN having their bit in said second state.

2. System according to claim 1, wherein said direct transfer circuit is adapted to running through said elementary array of the BIT_PATTERN in a predefined direction, thus considering a sequence of elements of the elementary array having the second state and to successively transferring the data of the array present in the source memory circuit and respectively associated with this sequence of elements.

3. System according to claim 1, wherein said direct transfer circuit is adapted to writing, into the destination memory circuit, the recovered data for an elementary pattern around a reference piece of data by rearranging them in a row or column vector, and wherein the destination memory circuit is a smart memory circuit adapted to implementing computing operations and to performing elementary operations including a reading or a writing of data from or into the memory circuit or a calculation based on data present in the memory circuit.

4. System according to claim 1, wherein said sub-region is a sequence of consecutive locations in terms of addressing defined from a base address BASE_ADDR containing the address of a first memory cell of the sub-region, each piece of data of the array having a dimension defined by a parameter EL_SIZE, the width of the rows of the array being defined by a parameter R_WIDTH; the address of a piece of data of the array being defined by relative coordinates Xpos and Ypos corresponding to the coordinates, row and column, in said array and from said base address BASE_ADDR, and from said parameter EL_SIZE, and wherein the data of the array are stored along a predefined direction of travel through the array.

5. System according to claim 2,
wherein said sub-region is a sequence of consecutive locations in terms of addressing defined from a base address BASE_ADDR containing the address of a first memory cell of the sub-region, each piece of data of the array having a dimension defined by a parameter EL_SIZE, the width of the rows of the array being defined by a parameter R_WIDTH; the address of a piece of data of the array being defined by relative coordinates Xpos and Ypos corresponding to the coordinates, row and column, in said array and from said base address BASE_ADDR, and from said parameter EL_SIZE, and wherein the data of the array are stored along a predefined direction of travel through the array,
wherein the coordinates $S[i] \cdot x$, in the row direction, and $S[i] \cdot y$, in the column direction, of an element of said elementary array associated with a BIT_PATTERN are defined by positive and negative indexes around zero coordinates associated with said reference element of the elementary array, the positive and negative indexes of a coordinate of an element of the elementary array being defined according to said data array and to said predefined direction of travel through said elementary array.

6. System according to claim 5, wherein the address Addr(Ax,y) of a piece of data of the array is defined according to the following formula:

Addr($Ax,y$)=BASE_ADDR+$EL$_SIZE*($X$pos*$R$_WIDTH+$Y$pos), and wherein the address Addr(S[i]) of data of the array corresponding to an element of the BIT_PATTERN to be transferred is defined according to the following formula:

Addr($S[i]$)=BASE_ADDR+$EL$_SIZE*($S[i]$·$x$*$R$_WIDTH+$S[i]$·$y$).

7. System according to claim 2,
wherein said direct transfer circuit is adapted to writing, into the destination memory circuit, the recovered data for an elementary pattern around a reference piece of data by rearranging them in a row or column vector, and wherein the destination memory circuit is a smart memory circuit adapted to implementing computing operations and to performing elementary operations including a reading or a writing of data from or into the memory circuit or a calculation based on data present in the memory circuit,
wherein said data sequence comprises a plurality of iterations of transfer of a same elementary pattern defined from a same BIT_PATTERN associated with said sequence of elements of the elementary array, each transfer iteration aiming at transferring data respectively located in a plurality of predefined elementary array windows of same dimensions of the source memory circuit and offset with respect to one another, the offsets being defined by a sequence of address offsets from the address of the source piece of data of the first elementary window, and wherein the direct transfer circuit is adapted, during the execution of the transfer, to performing for each element in the sequence of elements, a sequence of readings from the source memory circuit of the data corresponding to a same element of the elementary array but respectively located in said plurality of elementary array windows, by defining the successive addresses of the data of this sequence from the address of first piece of data corresponding to this element and associated with a first elementary array window and of said sequence of offsets and wherein the transfer circuit is adapted to transferring the data of said elementary array windows by respectively arranging them in distinct column vectors in the destination memory circuit, a sequence of data associated with a same elementary array element of the BIT_PATTERN being written into successive locations in terms of addressing of the destination memory in one or a plurality of rows of the destination memory.

8. System according to claim 1, wherein the direct transfer circuit is adapted to receiving and decoding the following transfer parameters:
SEQ_LEN: the number of iterations of the elementary pattern in the data sequence to be transferred;
SRC_OFFSET: the offset of the source addresses between two successive iterations of the elementary pattern of the data sequence to be transferred;
DST_OFFSET: the offset of the write addresses, in the destination memory circuit between two successive iterations of the elementary pattern of the data sequence to be transferred.

9. System according to claim 1, comprising at least a first and a second memory circuits; and
the direct transfer circuit being adapted to directly transferring data between the first and second memory circuits,
wherein the direct transfer circuit is adapted to receiving specific instructions from an external processor, and to decoding said instructions and accordingly control data transfers between the first and second circuits,
wherein said specific instructions comprise:
a specific instruction SET_REGION for defining a sub-region in the first memory circuit towards and from which the data will be transferred; and a specific instruction of transfer between said sub-region and the second memory circuit, the specific transfer instruction comprising a first address field containing the relative coordinates, in said sub-region, of a first reference cell, and wherein the direct transfer circuit is adapted to executing a plurality of successive instructions of transfer towards or from a same sub-region between two executions of an instruction SET_REGION.

* * * * *